United States Patent
Lee et al.

(10) Patent No.: US 11,605,335 B2
(45) Date of Patent: Mar. 14, 2023

(54) PIXEL AND METHOD FOR DRIVING PIXEL

(71) Applicant: Samsung Display Co., LTD., Yongin-si (KR)

(72) Inventors: Hyojin Lee, Yongin-si (KR); Sehyuk Park, Seongnam-si (KR); Hui Nam, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/436,869

(22) PCT Filed: Feb. 25, 2020

(86) PCT No.: PCT/KR2020/002700
§ 371 (c)(1),
(2) Date: Sep. 7, 2021

(87) PCT Pub. No.: WO2020/180036
PCT Pub. Date: Sep. 10, 2020

(65) Prior Publication Data
US 2022/0130325 A1    Apr. 28, 2022

(30) Foreign Application Priority Data

Mar. 4, 2019    (KR) .................... 10-2019-0024668

(51) Int. Cl.
*G09G 3/32*    (2016.01)
*H01L 27/15*    (2006.01)
(Continued)

(52) U.S. Cl.
CPC .......... *G09G 3/32* (2013.01); *H01L 27/156* (2013.01); *H01L 33/24* (2013.01); *H01L 33/44* (2013.01);
(Continued)

(58) Field of Classification Search
None
See application file for complete search history.

(56) References Cited

U.S. PATENT DOCUMENTS 9,589,504 B2    3/2017  Qing et al.
10,879,223 B2*  12/2020  Do ...................... H01L 25/50
(Continued)

FOREIGN PATENT DOCUMENTS

KR    10-0577297    5/2006
KR    10-0944957    3/2010
(Continued)

OTHER PUBLICATIONS

International Search Report, with English translation, corresponding to International Applicaion No. PCT/KR2020/002700 dated Jun. 12, 2020.
(Continued)

*Primary Examiner* — Dorothy Harris
(74) *Attorney, Agent, or Firm* — Kile Park Reed & Houtteman PLLC

(57) ABSTRACT

A pixel includes a switching transistor transmitting a data voltage to a first node, a storage capacitor electrically connected between a first power supply line and the first node and storing the data voltage, first and second driving transistors electrically connected to the first power supply line, the first node, and a second node, and first and second light emitting elements electrically connected between the second node and a second power supply line. An anode of the first light emitting element and a cathode of the second light emitting element are electrically connected to the second node, a cathode of the first light emitting element and an anode of the second light emitting element are electrically connected to the second power supply line, the first driving
(Continued)

transistor is a P-type transistor, and the second driving transistor is an N-type transistor.

28 Claims, 18 Drawing Sheets

(51) Int. Cl.
  *H01L 33/24* (2010.01)
  *H01L 33/44* (2010.01)
(52) U.S. Cl.
  CPC .............. *G09G 2300/0426* (2013.01); *G09G 2300/0452* (2013.01); *G09G 2300/0819* (2013.01); *G09G 2300/0842* (2013.01); *G09G 2310/08* (2013.01); *G09G 2320/0233* (2013.01); *G09G 2320/043* (2013.01); *G09G 2320/045* (2013.01)

(56) References Cited

U.S. PATENT DOCUMENTS

| | | | | |
|---|---|---|---|---|
| 2006/0238475 | A1* | 10/2006 | Oh | G09G 3/3233 345/92 |
| 2009/0096723 | A1 | 4/2009 | Kawabe | |
| 2015/0116191 | A1* | 4/2015 | Qi | G09G 3/3233 345/76 |
| 2015/0269886 | A1* | 9/2015 | Tan | G09G 3/3233 345/82 |
| 2015/0287359 | A1* | 10/2015 | Qing | G09G 3/3233 345/76 |
| 2015/0325169 | A1* | 11/2015 | Qing | G09G 3/32 345/76 |
| 2016/0019836 | A1* | 1/2016 | Qing | G09G 3/32 345/76 |
| 2016/0125803 | A1* | 5/2016 | Qing | G09G 3/3233 345/209 |
| 2016/0358547 | A1 | 12/2016 | Zhu et al. | |
| 2018/0019377 | A1* | 1/2018 | Kim | H01L 33/38 |
| 2019/0051242 | A1* | 2/2019 | Lee | G09G 3/3233 |

FOREIGN PATENT DOCUMENTS

| | | |
|---|---|---|
| KR | 10-2015-0049471 | 5/2015 |
| KR | 10-2017-0101334 | 9/2017 |
| KR | 10-2018-0009014 | 1/2018 |
| KR | 10-2019-0016640 | 2/2019 |

OTHER PUBLICATIONS

Written Opinion, with English translation, corresponding to International Application No. PCT/KR2020/002700, dated Jun. 12, 2020.

* cited by examiner

PIXEL AND METHOD FOR DRIVING PIXEL

CROSS-REFERENCE TO RELATED APPLICATION(S)

This application is a national entry of International Application No. PCT/KR2020/002700, filed on Feb. 25, 2020, which claims under 35 U.S.C. § 119(a) and 365(b) priority to and benefits of Korean Patent Application No. 10-2019-0024668, filed on Mar. 4, 2019 in the Korean Intellectual Property Office (KIPO), the entire contents of which are incorporated herein by reference.

BACKGROUND

1. Technical Field

Embodiments of the disclosure relate to a pixel and a method for driving the pixel that are capable of improving display device efficiency.

2. Discussion of the Related Art

Light emitting elements (e.g., light emitting diode LED) have high light conversion efficiency, significantly low energy consumption and semi-permanent lifespan, and are environmentally friendly. Accordingly, the light emitting elements may be used in many fields such as traffic lights, mobile phones, automobile headlights, outdoor electric signs, backlights, and indoor and outdoor lighting.

Recently, research and development has been conducted on display devices using a nano-sized ultra-small light emitting element as a light emitting element.

Nano-light emitting elements are generally deposited on a substrate through an ink printing method. With this technique, it may be difficult to deposit the nano-light emitting elements to be biased in the same direction in each pixel. Accordingly, there is an issue that a nano-light emitting element that is biased in the reverse direction may not emit light by direct-current driving of the pixel, thereby degrading the light emitting efficiency.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments of the disclosure may be directed to a pixel capable of improving light emitting efficiency and a method of driving the same.

According to an embodiment of the disclosure, a pixel may include a switching transistor that transmits a data voltage to a first node, a storage capacitor electrically connected between a first power supply line and the first node, the storage capacitor storing the data voltage, a first driving transistor electrically connected to the first power supply line, the first node, and a second node, a second driving transistor electrically connected to the first power supply line, the first node, and the second node, a first light emitting element electrically connected between the second node and a second power supply line, and a second light emitting element electrically connected between the second node and the second power supply line, wherein an anode of the first light emitting element and a cathode of the second light emitting element may be electrically connected to the second node, a cathode of the first light emitting element and an anode of the second light emitting element may be electrically connected to the second power supply line, the first driving transistor may be a P-type transistor, the second driving transistor may be an N-type transistor, gates of the first and second driving transistors may be electrically connected to the first node, sources of the first and second driving transistors may be electrically connected to the first power supply line, and drains of the first and second driving transistors may be electrically connected to the second node.

In an embodiment, a gate of the switching transistor may be electrically connected to a scan line to which a scan signal is applied, one of a source and a drain of the switching transistor may be electrically connected to a data line to which the data voltage is applied, and the other of the source and the drain of the switching transistor may be electrically connected to the first node.

In an embodiment, each of the first light emitting element and the second light emitting element may include at least one light emitting diode having a nano size.

In an embodiment, the first driving transistor may be a PMOS and the second driving transistor may be an NMOS.

In an embodiment, in a first period, a first driving voltage applied to the first power supply line may be higher than a second driving voltage applied to the second power supply line, and in a second period, the first driving voltage applied to the first power supply line may be lower than the second driving voltage applied to the second power supply line.

In an embodiment, the first period and the second period may alternately repeat.

In an embodiment, in the first period, the first driving transistor may be turned on, and the second driving transistor may be turned off, and in the second period, the first driving transistor may be turned off, and the second driving transistor may be turned on.

In an embodiment, one of the first driving voltage applied to the first power supply line and the second driving voltage applied to the second power supply line may maintain a constant value during the first period and the second period.

In an embodiment, each of the first period and the second period may correspond to a portion of one frame.

In an embodiment, each of the first period and the second period may correspond to at least one frame.

In an embodiment, a ratio of the second period to the first period may be substantially equal to a ratio of number of light emitting diodes of the second light emitting element to number of light emitting diodes of the first light emitting element.

In an embodiment, the pixel may further include an initialization transistor electrically connected to the second node, wherein a gate of the initialization transistor may be electrically connected to a scan line to which a scan signal is applied, one of a source and a drain of the initialization transistor may be electrically connected to the second node, and the other of the source and the drain of the initialization transistor may be electrically connected to an initialization power line.

In an embodiment, the pixel may further include an initialization transistor electrically connected to the second node, wherein a gate of the initialization transistor may be electrically connected to a scan line to which a scan signal is applied, one of a source and a drain of the initialization transistor may be electrically connected to the second node, and the other of the source and the drain of the initialization transistor may be electrically connected to the second power supply line.

According to an embodiment of the disclosure, a pixel may include a switching transistor that transmits a data voltage to a first node, a first storage capacitor electrically connected between a (1-1)-st power supply line and the first node, the first storage capacitor storing the data voltage, a second storage capacitor electrically connected between a (1-2)-nd power supply line and the first node, the second storage capacitor storing the data voltage, a first driving transistor electrically connected to the (1-1)-st power supply line, the first node, and the second node, a second driving transistor electrically connected to the (1-2)-nd power supply line, the first node, and the second node, a first light emitting element electrically connected between the second node and a second power supply line, and a second light emitting element electrically connected between the second node and the second power supply line, wherein an anode of the first light emitting element and a cathode of the second light emitting element may be electrically connected to the second node, a cathode of the first light emitting element and an anode of the second light emitting element may be electrically connected to the second power supply line, the first driving transistor may be a P-type transistor, the second driving transistor may be an N-type transistor, gates of the first and second driving transistors may be electrically connected to the first node, a source of the first driving transistor may be electrically connected to the (1-1)-st power supply line, a source of the second driving transistor may be electrically connected to the (1-2)-nd power supply line, and drains of the first and second driving transistors may be electrically connected to the second node.

In an embodiment, a gate of the switching transistor may be electrically connected to a scan line to which a scan signal is applied, one of a source and a drain of the switching transistor may be electrically connected to a data line to which the data voltage is applied, and the other of the source and the drain of the switching transistor may be electrically connected to the first node.

In an embodiment, each of the first light emitting element and the second light emitting element may include at least one light emitting diode having a nano size.

In an embodiment, the first driving transistor may be a PMOS and the second driving transistor may be an NMOS.

In an embodiment, in a first period, the first driving transistor may be turned on or turned off, and the second driving transistor may be turned off, in a second period, the first driving transistor may be turned off, and the second driving transistor may be turned on or turned off, and the first period and the second period may alternately repeat.

In an embodiment, in the first period and the second period, a (1-1)-st driving voltage applied to the (1-1)-st power supply line may be higher than a second driving voltage applied to the second power supply line, and a (1-2)-nd driving voltage applied to the (1-2)-nd power supply line may be lower than the second driving voltage applied to the second power supply line.

In an embodiment, in the first period, the data voltage may be lower than a value obtained by adding a threshold voltage of the second driving transistor to the (1-2)-nd driving voltage, and in the second period, the data voltage may be higher than a value obtained by subtracting the threshold voltage of the second driving transistor from the (1-1)-st driving voltage.

In an embodiment, each of the first period and the second period may correspond to a portion of one frame.

In an embodiment, each of the first period and the second period may correspond to at least one frame.

In an embodiment, a ratio of the second period to the first period may be substantially equal to a ratio of number of light emitting diodes of the second light emitting element to number of light emitting diodes of the first light emitting element.

In an embodiment, in the first period, a (1-1)-st driving voltage applied to the (1-1)-st power supply line may be higher than a second driving voltage applied to the second power supply line, in the second period, the (1-1)-st power supply line may float, in the second period, a (1-2)-nd driving voltage applied to the (1-2)-nd power supply line may be lower than the second driving voltage applied to the second power supply line, and in the first period, the (1-2)-nd power supply line may float.

In an embodiment, in the first period, a (1-1)-st driving voltage applied to the (1-1)-st power supply line may be higher than a second driving voltage applied to the second power supply line, in the second period, a (1-2)-nd driving voltage applied to the (1-2)-nd power supply line may be lower than the second driving voltage applied to the second power supply line, the (1-1)-st driving voltage applied in at least a portion of the second period to the (1-1)-st power supply line may be substantially equal to the (1-2)-nd driving voltage applied to the (1-2)-nd power supply line in the second period, and the (1-2)-nd driving voltage applied in at least a portion of the first period to the (1-2)-nd power supply line may be substantially equal to the (1-1)-st driving voltage applied to the (1-1)-st power supply line in the first period.

In an embodiment, the pixel may further include an initialization transistor connected to the second node, wherein a gate of the initialization transistor may be electrically connected to a scan line to which a scan signal is applied, one of a source and a drain of the initialization transistor may be electrically connected to the second node, and the other of the source and the drain of the initialization transistor may be electrically connected to an initialization power line.

In an embodiment, the pixel may further include an initialization transistor electrically connected to the second node, wherein a gate of the initialization transistor may be electrically connected to a scan line to which a scan signal is applied, one of a source and a drain of the initialization transistor may be electrically connected to the second node, and the other of the source and the drain of the initialization transistor may be electrically connected to the second power supply line.

In an embodiment, the pixel may further include an initialization transistor electrically connected to the first node, wherein a gate of the initialization transistor may be electrically connected to a scan line to which a previous scan signal is applied, one of a source and a drain of the initialization transistor may be electrically connected to the first node, and the other of the source and the drain of the initialization transistor may be electrically connected to an initialization power line.

In an embodiment, the pixel may further include an initialization transistor electrically connected to the first node, wherein a gate of the initialization transistor may be electrically connected to a scan line to which a previous scan signal is applied, one of a source and a drain of the initialization transistor may be electrically connected to the first node, the other of the source and the drain of the initialization transistor may be electrically connected to an initialization power line, in case that the previous scan signal is applied in the second period, an initialization voltage substantially equal to the (1-1)-st driving voltage may be applied to the initialization power line, and in case that the previous scan signal is applied in the first period, the initialization voltage substantially equal to the (1-2)-nd driving voltage may be applied to the initialization power line.

According to one or more embodiments of the disclosure, a pixel and a method of driving the pixel may provide the following and other effects.

According to an embodiment, light emitting elements in a pixel that may be biased in opposite directions may alternately emit light. Accordingly, the light emitting efficiency of the display device including the pixel may be improved.

DETAILED DESCRIPTION OF THE EMBODIMENTS

Figure 1:
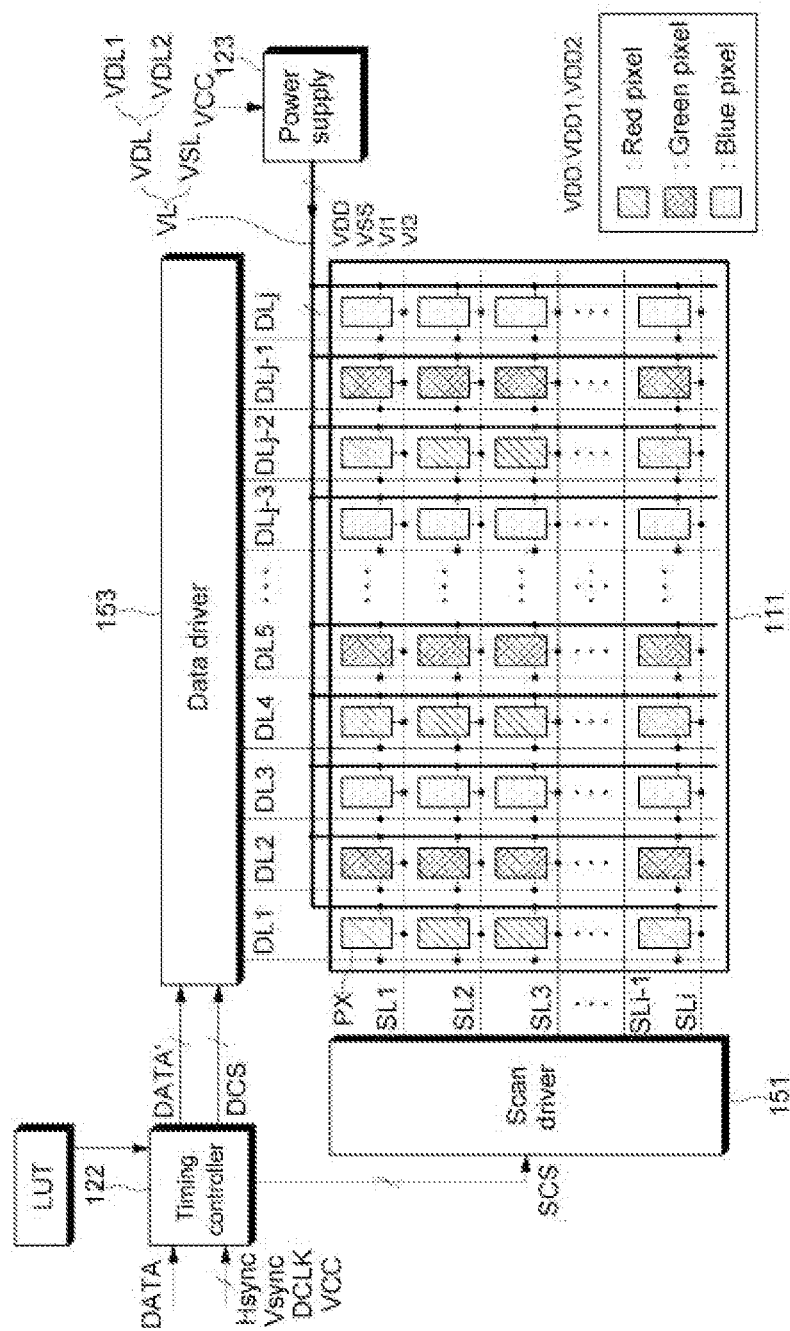
FIG. 1 is a schematic view illustrating a display device according to an embodiment.

Advantages and features of the disclosure and methods for achieving them will be made clear from embodiments described below in detail with reference to the accompanying drawings. The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art. Elements, operations and techniques that will already be appreciated by one of ordinary skill in the art may not be described in detail in the embodiments in order to prevent the disclosure from being obscured. Like reference numerals refer to like elements throughout the specification.

As used herein, the singular forms, "a," "an," and "the" are intended to include the plural forms as well (and vice versa), unless the context clearly indicates otherwise. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that the terms "connected to" or "coupled to" may include a physical or electrical connection or coupling. When an element is referred to as being "connected" to another element, the element may be "directly connected" to the another element, or "electrically connected" to the another element with one or more intervening elements interposed therebetween. It will be further understood that the terms such as "comprises," "including," "includes", "have", "has", and/or "having" used in this specification specify the presence of stated features, integers, steps, operations, elements and/or components, but do not preclude the presence or addition of one or more other features, integers, steps, operations, elements, components and/or groups thereof.

It will be understood that, although the terms "first," "second," "third," or the like may be used herein to describe various elements, these elements should not be limited by these terms. These terms are only used to distinguish one element from another element. Accordingly, "a first element" discussed below could be termed "a second element" or "a third element," and "a second element" and "a third element" may be termed likewise without departing from the teachings herein.

"About", "approximately", and "substantially", as used herein, are inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Hereinafter, display devices according to embodiments of the disclosure will be described with reference to FIGS. 1 to 21.

FIG. 1 is a schematic view illustrating a display device according to an embodiment.

As illustrated in FIG. 1, a display device according to an embodiment may include a display panel 111, a scan driver 151, a data driver 153, a timing controller 122, a look-up table LUT, and a power supply 123.

The display panel 111 may include pixels PX, and scan lines SLn (SL1 to SLi), data lines DLm (DL1 to DLj) and a power supply line VL for transmitting various signals required for the pixels PX to display images. In such an embodiment, i may be a natural number greater than 2, and j may be a natural number greater than 3. According to an embodiment, the power supply line VL may include a first power supply line VDL and a second power supply line VSL that may be electrically separated from each other. According to an embodiment, the first power supply line VDL may include a (1-1)-st power supply line VDL1 and a (1-2)-nd power supply line VDL2 that may be electrically separated from each other.

The pixels PX may be arranged at the display panel 111 in a matrix form.

Each pixel PX may include at least one light emitting element (e.g., light emitting diode LED). At least some of the pixels PX may include light emitting elements LED connected in parallel and biased in opposite directions.

At least two pixels PX among all the pixels PX (e.g., i*j pixels PX) may include different numbers of light emitting elements LED. For example, if a pixel PX includes five light emitting elements LED connected in parallel, another pixel PX may include one light emitting element LED.

At least one pixel PX among all the pixels PX may include at least one first light emitting element LED1 which may be arranged (biased) in a forward direction and at least one second light emitting element LED2 that may be arranged (biased) in a reverse direction. For example, if a pixel PX includes five light emitting elements LED, three of the first light emitting elements LED1 may be arranged in the forward direction and the other two second light emitting elements LED2 may be arranged in the reverse direction. The first light emitting element LED1 refers to an element that emits light by a positive current flowing from the first power supply line VDL to the second power supply line VSL (hereinafter, the direction of this current may be referred to as a forward direction, and the opposite direction may be referred to as a reverse direction), and the second light emitting element LED2 refers to an element that emits light by a current flowing from the second power supply line VSL to the first power supply line VDL.

At least two pixels PX of all pixels PX may include different numbers of first light emitting elements LED1. At least two pixels PX of all pixels PX may include different numbers of second light emitting elements LED2. A ratio of the first light emitting element LED1 and the second light emitting element LED2 included in a pixel PX may be equal to or different from a ratio of the first light emitting element LED1 and the second light emitting element LED2 included in another pixel PX.

The pixels PX may include a red pixel PX displaying red, a green pixel PX displaying green, and a blue pixel PX displaying blue.

The red pixel PX may include at least one red light emitting element LED emitting red light, the green pixel PX may include at least one green light emitting element LED emitting green light, and the blue pixel PX may include at least one blue light emitting element LED that emits blue light.

Information on the number of the first light emitting elements LED1 and the number of the second light emitting elements LED2 included in each pixel PX may be stored in advance in the look-up table LUT. For example, information on the number and ratio of the first light emitting elements LED1 and the reverse light emitting elements LED2 included in each of the i*j pixels PX may be stored in advance in the look-up table LUT. For example, in this look-up table LUT, information on the number and ratio of the first light emitting elements LED1 and the reverse light emitting elements LED2 included in the entire i*j pixels PX may be stored in advance.

Information on the number of the first light emitting elements LED1 and the number of the second light emitting elements LED2 (or a ratio between the numbers) included in each pixel PX or the number of the first light emitting elements LED1 and the number of the second light emitting elements LED2 (or a ratio between the numbers) included in the entire pixels PX may be obtained through a photograph taken by a camera or a magnitude and direction of a current detected from each pixel PX of the display panel 111. For example, as the number of the first light emitting elements LED1 in a pixel PX or the entire pixels PX increases, a forward current detected from the pixel PX or the entire pixels PX may increase. Similarly, as the number of the reverse light emitting elements LED2 increases, a reverse current may increase.

A system (not illustrated) located outside the display panel 111 may output a vertical synchronization signal Vsync, a horizontal synchronization signal Hsync, a clock signal DCLK, a power signal VCC and image data DATA through a low voltage differential signaling (LVDS) transmitter of a graphic controller. The vertical synchronization signal Vsync, the horizontal synchronization signal Hsync, the clock signal DCLK, and the power signal VCC output from the system may be applied to a timing controller 122. Image data voltages Vdata(DATA) sequentially output from the system may be applied to the timing controller 122.

The timing controller 122 may correct each of the image data voltages Vdata(DATA) of the pixels PX applied from the system to generate corrected image data voltages Vdata(DATA'), and apply the corrected image data voltages Vdata(DATA') to the data driver 153. In such an embodiment, the timing controller 122 may correct the image data voltages Vdata(DATA) of the corresponding pixel PX based on the number of the first light emitting elements LED1 and the number of the second light emitting elements LED2 included in the corresponding pixel PX and a ratio between the numbers. For example, the timing controller 122 may identify the number of the forward light emitting elements LED1 and the number of the reverse light emitting elements LED2 of the corresponding pixel PX and a ratio between them, based on the information provided from the look-up table LUT, and may correct the image data voltage Vdata of the corresponding pixel PX based on the identified number and ratio of the light emitting elements LED1 and LED2.

The timing controller 122 may generate a data control signal DCS and a scan control signal SCS by using the vertical synchronization signal Vsync, the horizontal synchronization signal Hsync, and the clock signal DCLK input to the timing controller 122 and provide them to the data driver 153 and the scan driver 151. The data control signal DCS may be applied to the data driver 153, and the scan control signal SCS may be applied to the scan driver 151.

The data control signal DCS may include a dot clock, a source shift clock, a source enable signal, and a polarity inversion signal.

The scan control signal SCS may include a gate start pulse, a gate shift clock, and a gate output enable signal.

After sampling the corrected image data voltages Vdata (DATA') according to the data control signal DCS from the timing controller 122, the data driver 153 may sample sampling data voltages Vdata of one horizontal line for each horizontal period (Horizontal Time: 1H, 2H, . . . ), and apply the latched data voltages Vdata to the data lines DLm to DL1 to DLj. For example, the data driver 153 may convert the image data voltage Vdata from the timing controller 122 into analog data voltages Vdata using a gamma voltage input from the power supply 123 and apply the converted analog data voltages Vdata to the data lines DLm (DL1 to DLj). The data voltage Vdata(Vdata) respectively applied to the data lines DLm (DL1 to DLj) will be hereinafter referred to as a data voltage Vdata(Vdata).

The scan driver 151 may include a shift register for generating scan signals in response to the gate start pulse SCS from the timing controller 122, and a level shifter for shifting the scan signals to voltage levels suitable for driving the pixel PX. The scan driver 151 may supply first to i-th scan signals Scan to the scan lines SLn (SL1 to SLi) in response to the scan control signal SCS from the timing controller 122, respectively.

The power supply 123 may generate gamma voltages, a first driving voltage VDD, and a second driving voltage VSS by using the power signal VCC. The power supply 123 may supply the gamma voltages to the data driver 153, supply the first driving voltage VDD to the first power supply line VDL, and supply the second driving voltage VSS to the second power supply line VSL. The power supply 123 may include a first power supply supplying the first driving voltage VDD and a second power supply supplying the second driving voltage VSS. The power supply 123 may supply a (1-1)-st driving voltage VDD1 to a (1-1)-st power supply line VDL1 and supplies a (1-2)-nd driving voltage VDD2 to a (1-2)-nd power supply line VDL2. The power supply 123 may include a (1-1)-st power supply supplying the (1-1)-st driving voltage VDD1 and a (1-2)-nd power supply supplying the (1-2)-nd driving voltage VDD2.

Figure 2:
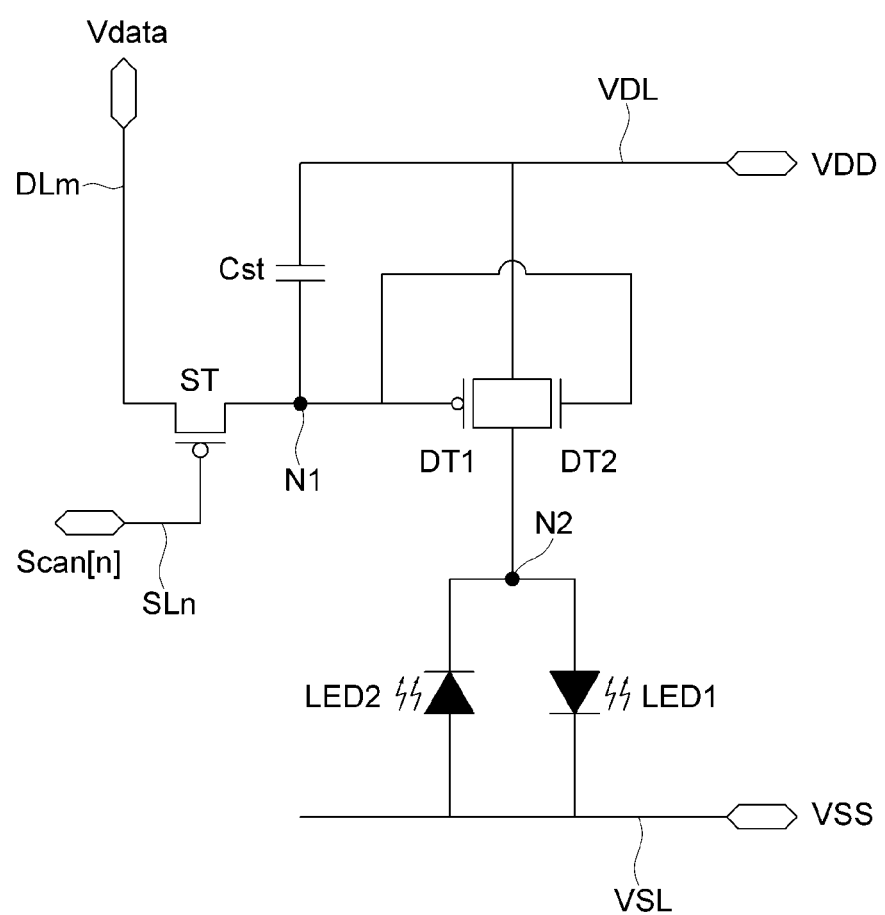
FIG. 2 is a schematic circuit diagram illustrating a circuit provided in a pixel according to an embodiment.

FIG. 2 is a schematic circuit diagram illustrating a circuit provided in a pixel according to an embodiment.

Referring to FIG. 2, a pixel PX may include the first light emitting element LED1 and the second light emitting element LED2, and a pixel circuit which may selectively apply a driving current to the first light emitting element LED1 and the second light emitting element LED2.

The pixel circuit may include a switching circuit which transmits the data voltage Vdata applied to the data line DLm, a storage circuit which stores the transmitted data voltage Vdata, and a driving circuit which controls the first light emitting element LED1 and the second light emitting element LED2 according to the stored data voltage Vdata.

The switching circuit may include a data line DLm, a scan line SLn, and a switching transistor ST connected to a first node N1. The storage circuit may include a storage capacitor Cst connected to the first node N1 and the first power supply line VDL. The driving circuit may be connected to each of the first node N1, the first power supply line VDL, and a second node N2, respectively, and include a first driving transistor DT1 and a second driving transistor DT2 that may be complementary types to each other.

Figure 5:
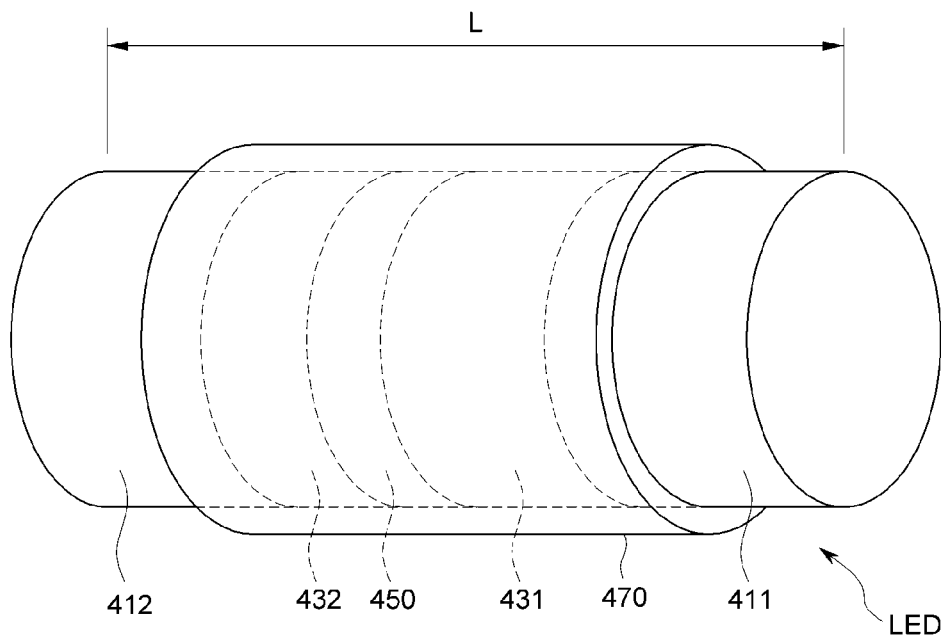
FIG. 5 is a schematic detailed view illustrating any one light emitting element of FIG. 3.

The light emitting element LED may include a nano-sized ultra-small light emitting diode LED illustrated in FIG. 5. The light emitting diode LED may include at least two light emitting diodes LED1 and LED2 which may each be connected to the second node N2 and the second power supply line VSL and may be biased oppositely to each other. The light emitting diode may include the first light emitting diode LED1 and the second light emitting diode LED2. An anode of the first light emitting diode LED1 and a cathode of the second light emitting diode LED2 may be connected to the second node N2, and a cathode of the first light emitting diode LED1 and an anode of the second light emitting diode LED2 may be connected to the second power supply line VSL.

According to the first driving voltage VDD, the second driving voltage VSS, and the data voltage Vdata of the first node N1, the first light emitting element LED1 and the second light emitting element LED2 may alternately emit light.

Hereinafter, a connection relationship between each transistor and the light emitting element will be described in detail with reference to FIG. 2.

The switching transistor ST may include a first gate electrode connected to an n-th scan line SLn and may be connected between an m-th data line DLm and the first node N1. One of a first source electrode and a first drain electrode of the switching transistor ST may be connected to the m-th data line DLm, and the other of the first source electrode and the first drain electrode may be connected to the first node N1. For example, the first source electrode of the switching transistor ST may be connected to the m-th data line DLm, and the first drain electrode of the switching transistor ST may be connected to the first node N1. In such an embodiment, m may be a natural number. The switching transistor ST may be a P-type or N-type transistor. The switching transistor ST may be a PMOS or NMOS transistor.

The first driving transistor DT1 includes a second gate electrode connected to the first node N1 and may be connected between the first power supply line VDL and the second node N2. In an embodiment, the first driving transistor DT1 may be a P-type transistor or a PMOS transistor. One of a second source electrode and a second drain electrode of the first driving transistor DT1 may be connected to the first power supply line VDL, and the other of the second source electrode and the second drain electrode may be connected to the second node N2. For example, the second source electrode of the first driving transistor DT1 may be connected to the first power supply line VDL, and the second drain electrode of the first driving transistor DT1 may be connected to the second node N2. The first driving transistor DT1 may control a magnitude of a current flowing from the first power supply line VDL to the second node N2

(a current flowing from the second source electrode to the second drain electrode) according to the data voltage Vdata applied to the second gate electrode.

The second driving transistor DT2 may include a third gate electrode connected to the first node N1 and may be connected between the first power supply line VDL and the second node N2. In an embodiment, the second driving transistor DT2 may be an N-type transistor or an NMOS transistor. In an embodiment, the first driving transistor DT1 and the second driving transistor DT2 may be mutually complementary transistors, for example, CMOS transistors. One of a third source electrode and a third drain electrode of the second driving transistor DT2 may be connected to the first power supply line VDL, and the other of the third source electrode and the third drain electrode may be connected to the second node N2. For example, the third source electrode of the second driving transistor DT2 may be connected to the first power supply line VDL, and the third drain electrode of the second driving transistor DT2 may be connected to the second node N2. The second driving transistor DT2 may control a magnitude of a current flowing from the second node N2 to the first power supply line VDL (a current flowing from the third drain electrode to the third source electrode) according to the data voltage Vdata applied to the third gate electrode.

The storage capacitor Cst may be connected between the first node N1 and the first power supply line VDL. The storage capacitor Cst may store the data voltage Vdata applied to the first node N1, that is, the data voltage Vdata applied to the second gate electrode of the first driving transistor DT1 and the third gate electrode of the second driving transistor DT2 for one frame or a partial period of one frame.

Figure 3:
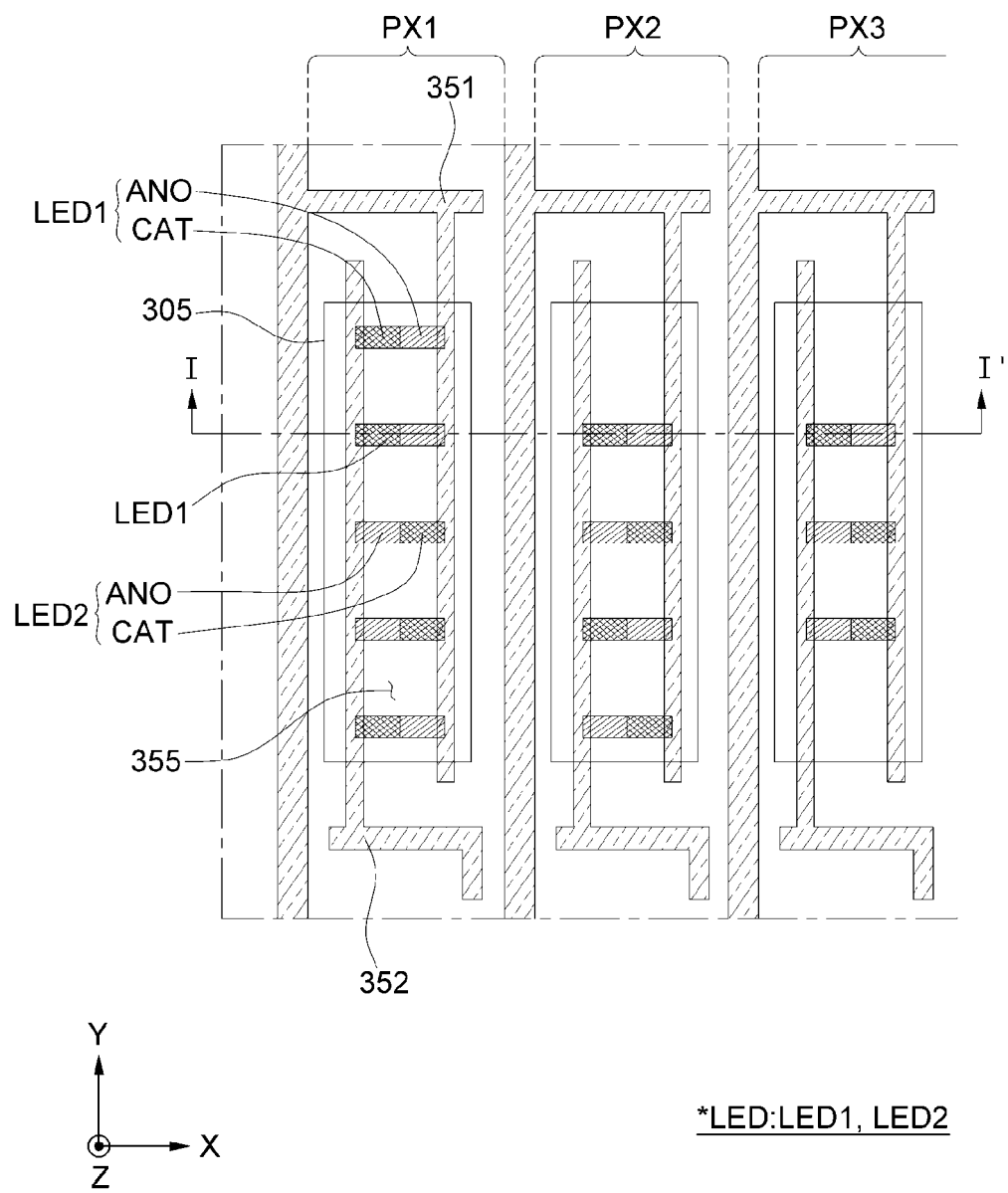
FIG. 3 is a schematic plan view illustrating three adjacent pixels of FIG. 1.
Figure 4:
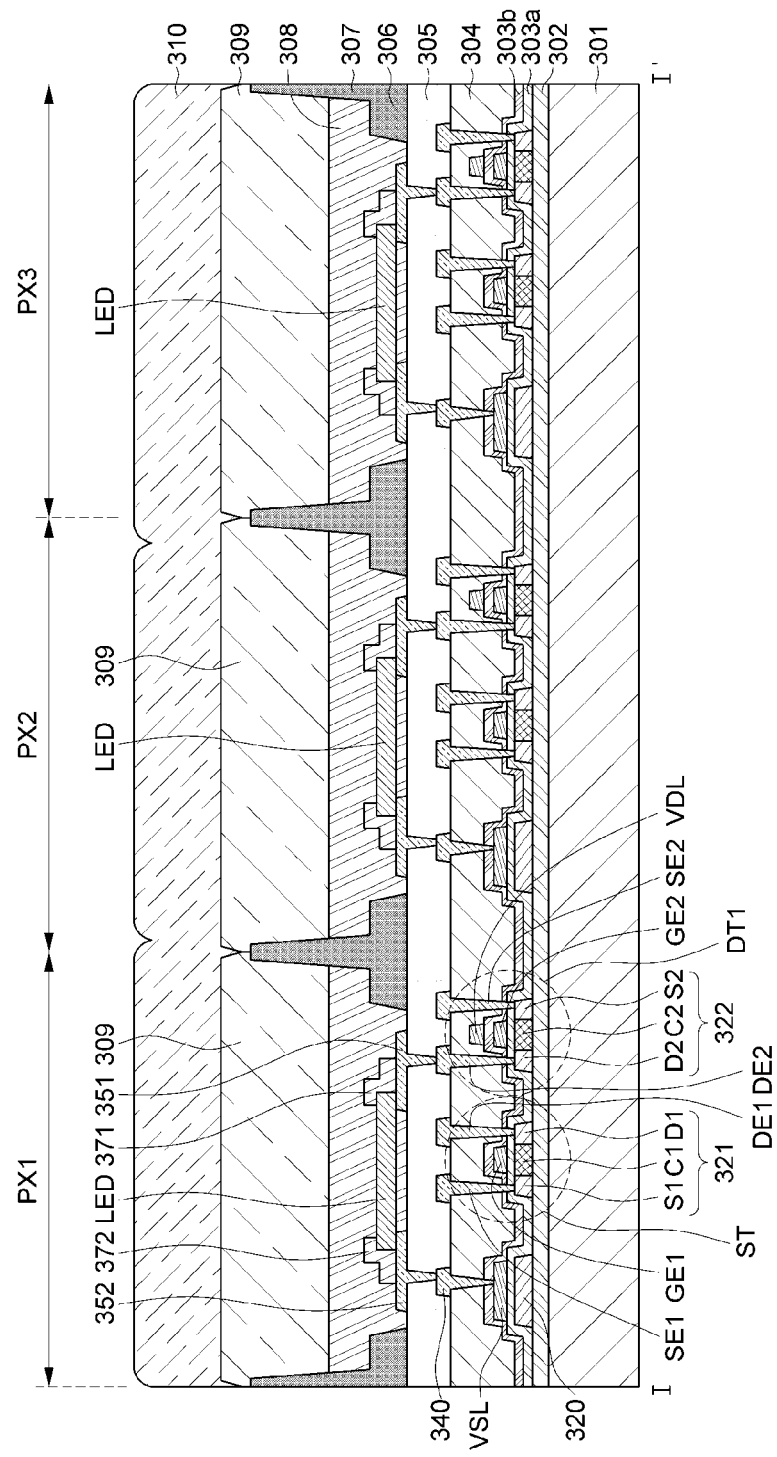
FIG. 4 is a schematic cross-sectional view taken along line I-I' of FIG. 3.

FIG. 3 is a schematic plan view illustrating three adjacent pixels PX of FIG. 1, and FIG. 4 is a schematic cross-sectional view taken along line I-I' of FIG. 3.

As illustrated in FIGS. 3 and 4, a display device may include a substrate 301, a buffer layer 302, a first gate insulating film 303a, a second gate insulating film 303b, an insulating interlayer 304, a planarization layer 305, a switching transistor ST, a first driving transistor DT1 (a P-type transistor, PMOS transistor), a second driving transistor DT2 (although not illustrated in FIG. 4, the second driving transistor DT2 has the same structure and connection relationship to other elements as in the first driving transistor DT1, except that the second driving transistor DT2 may be an N-type transistor, NMOS transistor), and a dummy layer 320.

The switching transistor ST may include a first semiconductor layer 321, a first gate electrode GE1, a first source electrode SE1, and a first drain electrode DE1.

The first driving transistor DT1 may include a second semiconductor layer 322, a second gate electrode GE2, a second source electrode SE2, and a second drain electrode DE2.

The second driving transistor DT2 may include a third semiconductor layer (not illustrated), a third gate electrode (not illustrated), a third source electrode (not illustrated), and a third drain electrode (not illustrated).

The buffer layer 302 may be positioned on the substrate 301. The buffer layer 302 may overlap the entire surface of the substrate 301.

The first semiconductor layer 321, the second semiconductor layer 322, the third semiconductor layer (not illustrated), and the dummy layer 320 may be positioned on the buffer layer 302.

The first gate insulating film 303a may be disposed (i.e., positioned) on the first semiconductor layer 321, the second semiconductor layer 322, the third semiconductor layer (not illustrated), and the buffer layer 302. The first gate insulating film 303a may overlap the entire surface of the substrate 301.

The first gate electrode GE1, the second gate electrode GE2, the third gate electrode (not illustrated), and the second power supply line VSL may be positioned on the first gate insulating film 303a. In such an embodiment, the first gate electrode GE1 may be positioned on the first gate insulating film 303a to overlap a channel region C1 of the first semiconductor layer 321, the second gate electrode GE2 may be positioned on the first gate insulating film 303a to overlap a channel region C2 of the second semiconductor layer 322, the third gate electrode (not illustrated) may be positioned on the first gate insulating film 303a to overlap a channel region (not illustrated) of the third semiconductor layer (not illustrated), and the second power supply line VSL may be positioned on the first gate insulating film 303a to overlap the dummy layer 320.

The second gate insulating film 303b may be positioned on the first gate electrode GE1, the second gate electrode GE2, the third gate electrode (not illustrated), the second power supply line VSL, and the first gate insulating film 303a. The second gate insulating film 303b may overlap the entire surface of the substrate 301.

The first power supply line VDL may be positioned on the second gate insulating film 303b. The first power supply line VDL may be positioned on the second gate insulating film 303b to overlap the second gate electrode GE2 and the third gate electrode (not illustrated). The storage capacitor Cst may be positioned between the first power supply line VDL and the second gate electrode GE2 and between the first power supply line VDL and the third gate electrode (not illustrated).

The insulating interlayer 304 may be positioned on the first power supply line VDL and the second gate insulating film 303b. The insulating interlayer 304 may overlap the entire surface of the substrate 301.

The first source electrode SE1, the first drain electrode DE1, the second source electrode SE2, the second drain electrode DE2, the third source electrode (not illustrated), the third drain electrode (not illustrated), and a connection electrode 340 may be positioned on the insulating interlayer 304.

The first source electrode SE1 may be connected to a first source region S1 of the first semiconductor layer 321 through a first source contact hole defined through the insulating interlayer 304, the second gate insulating film 303b, and the first gate insulating film 303a.

The first drain electrode DE1 may be connected to a first drain region D1 of the first semiconductor layer 321 through a first drain contact hole defined through the insulating interlayer 304, the second gate insulating film 303b, and the first gate insulating film 303a. Although not illustrated, the first drain electrode DE1 may be connected to the second gate electrode GE2 and the third gate electrode (not illustrated) through respective contact holes defined through the insulating interlayer 304 and the second gate insulating film 303b.

The second source electrode SE2 may be connected to a second source region S2 of the second semiconductor layer 322 through a second source contact hole defined through the insulating interlayer 304, the second gate insulating film 303b, and the first gate insulating film 303a. Although not illustrated, the second source electrode SE2 may be connected to the first power supply line VDL through a contact hole defined through the insulating interlayer 304.

The second drain electrode DE2 may be connected to a second drain region D2 of the second semiconductor layer 322 through a second drain contact hole defined through the insulating interlayer 304, the second gate insulating film 303b, and the first gate insulating film 303a.

The third source electrode (not illustrated) may be connected to a third source region (not illustrated) of the third semiconductor layer (not illustrated) through a third source contact hole defined through the insulating interlayer 304, the second gate insulating film 303b and the first gate insulating film 303a. The third source electrode (not illustrated) may be connected to the first power supply line VDL through a contact hole defined through the insulating interlayer 304.

The third drain electrode (not illustrated) may be connected to a third drain region (not illustrated) of the third semiconductor layer (not illustrated) through a third drain contact hole defined through the insulating interlayer 304, the second gate insulating film 303b and the first gate insulating film 303a.

The connection electrode 340 may be connected to the second power supply line VSL through a contact hole defined through the insulating interlayer 304 and the second gate insulating film 303b.

The planarization layer 305 may be positioned on the first source electrode SE1, the first drain electrode DE1, the second source electrode SE2, the second drain electrode DE2, the third source electrode (not illustrated), the third drain electrode (not illustrated), the connection electrode 340, and the insulating interlayer 304.

A first electrode portion 351 and a second electrode portion 352 may be positioned on the planarization layer 305.

The first electrode portion 351 may be connected to the second drain electrode DE2 and the third drain electrode (not illustrated) through a first contact hole defined through the planarization layer 305.

The second electrode portion 352 may be connected to the connection electrode 340 through a second contact hole defined through the planarization layer 305. The second electrode portion 352 may be connected to the second power supply line VSL through the connection electrode 340.

The light emitting element LED may be positioned on the first electrode portion 351, the second electrode portion 352, and the planarization layer 305. For example, the anode electrode of the first light emitting element LED1 may be connected to the first electrode portion 351, and the cathode electrode of the first light emitting element LED1 may be connected to the second electrode portion 352. The cathode electrode of the second light emitting element LED2 may be connected to the first electrode portion 351, and the anode electrode of the second light emitting element LED2 may be connected to the second electrode portion 352.

A first pixel PX1, a second pixel PX2, and a third pixel PX3 may include light emitting elements LED that emit light of different colors. For example, the light emitting element LED of the first pixel PX1 may be a red light emitting element emitting red light, the light emitting element LED of the second pixel PX2 may be a green light emitting element emitting green light, and the light emitting element LED of the third pixel PX3 may be a blue light emitting element LED1 emitting blue light.

As illustrated in FIG. 3, the first to third pixels PX1, PX2, and PX3 may include different numbers of the light emitting elements LED. The first to third pixels PX1, PX2, and PX3 may include different numbers of the first light emitting elements LED1. The first to third pixels PX1, PX2, and PX3 may include different numbers of the second light emitting elements LED2. A ratio of the first light emitting element LED1 and the second light emitting element LED2 of a pixel PX1, PX2, and PX3 may be substantially the same as or different from that of another pixel PX. For example, the first pixel PX1 may include three first light emitting elements LED1 and two second light emitting elements LED2, the second pixel PX2 may include two first light emitting elements LED1 and two second light emitting elements LED2, and the third pixel PX3 may include one first light emitting element LED1 and two second light emitting elements LED2.

A first contact electrode 371 may connect the first electrode portion 351 and the anode ANO of the first light emitting element LED1 to each other and connect the first electrode portion 351 and the cathode CAT of the second light emitting element LED2 to each other. A second contact electrode 372 may connect the second electrode portion 352 and the anode ANO of the second light emitting element LED2 to each other and connect the second electrode portion 352 and the cathode CAT of the first light emitting element LED1 to each other. A light blocking film 306 may be positioned on the planarization layer 305. The light blocking film 306 may have an opening 355 defining an area of the pixel PX. The above-described light emitting element LED may be positioned in the area of the pixel PX.

A spacer 307 may be positioned on the light blocking film 306. A width of the spacer 307 may be less than a width of the light blocking film 306, and a thickness of the spacer 307 may be less than a thickness of the light blocking film 306. The width of the spacer 307 and the width of the light blocking film 306 refer to the size in an X-axis direction, and the thickness of the spacer 307 and the thickness of the light blocking film 306 refer to the size in a Z-axis direction.

A passivation film 308 may be positioned on the light blocking film 306, the light emitting element LED, the first electrode portion 351, the second electrode portion 352, the first contact electrode 371, the second contact electrode 372, and the planarization layer 305.

An anti-reflection film 309 may be positioned on the passivation film 308 and the spacer 307. The anti-reflection film 309 prevents reflection of light incident on the display device from the outside.

The first pixel PX1, the second pixel PX2, and the third pixel PX3 may include anti-reflection films 309 of different colors. For example, the anti-reflection film 309 of the first pixel PX1 may be a red anti-reflection film which prevents reflection of red light, the anti-reflection film 309 of the second pixel PX2 may be a green anti-reflection film which prevents reflection of green light, and the anti-reflection film 309 of the third pixel PX1 may be a blue anti-reflection film which prevents reflection of blue light.

An encapsulation layer 310 may be positioned on the anti-reflection film 309 and the spacer 307. The encapsulation layer 310 may overlap the entire surface of the substrate 301.

FIG. 5 is a schematic detailed view illustrating any one light emitting diode of FIG. 3.

The light emitting diode LED may be, for example, a nano-sized ultra-small light emitting diode, and may have a cylindrical shape as illustrated in FIG. 5. Although not illustrated, the light emitting diode LED may have a quadrangular parallelepiped shape or various other shapes.

The light emitting diode LED may include a first electrode 411, a second electrode 412, a first semiconductor layer 431, a second semiconductor layer 432, and an active layer 450. In an embodiment, the light emitting element LED may further include an insulating film 470 in addition to the aforementioned components 411, 412, 431, 432, and 450.

The first semiconductor layer 431 may be positioned between the first electrode 411 and the active layer 450.

The active layer 450 may be positioned between the first semiconductor layer 431 and the second semiconductor layer 432.

The second semiconductor layer 432 may be positioned between the active layer 450 and the second electrode 412.

The insulating film 470 may have a ring shape surrounding a portion of the first electrode 411, a portion of the second electrode 412, the first semiconductor layer 431, the active layer 450, and the second semiconductor layer 432. As another example, the insulating film 470 may have a ring shape surrounding only the active layer 450. The insulating film 470 may prevent contact between the active layer 450 and the first electrode portion 351 and prevent contact between the active layer 450 and the second electrode portion 352. The insulating film 470 may protect an outer surface including the active layer 450 to prevent light emitting efficiency of the light emitting element LED from being degraded.

The first electrode 411, the first semiconductor layer 431, the active layer 450, the second semiconductor layer 432, and the second electrode 412 may be sequentially stacked on each other in a length direction of the light emitting element LED. In such an embodiment, a length of the light emitting element LED1 may refer to the size in the X-axis direction. For example, the length L of the light emitting element LED1 may be in a range of about 2 μm to about 5 μm.

The first and second electrodes 411 and 412 may be ohmic contact electrodes. However, the first and second electrodes 411 and 412 are not limited thereto and may be Schottky contact electrodes.

The first and second electrodes 411 and 412 may include a conductive metal. For example, the first and second electrodes 411 and 412 may include one or more metal materials of aluminum, titanium, indium, gold, and silver. The first and second electrodes 411 and 412 may include the same material. In other embodiments, the first and second electrodes 411 and 412 may include different materials.

The first semiconductor layer 431 may include, for example, an n-type semiconductor layer. As an example, in case that the light emitting element LED is a blue light emitting element LED, the n-type semiconductor layer may include a semiconductor material having an empirical formula of $In_xAl_yGa_{1-x-y}N$ ($0 \le x \le 1$, $0 \le y \le 1$, $0 \le x+y \le 1$), for example, at least one of InAlGaN, GaN, AlGaN, InGaN, AlN, and InN. The n-type semiconductor material may be doped with a first conductive dopant (e.g., Si, Ge, Sn, etc.).

The light emitting element LED of a different color other than the above-described blue light emitting element LED may include a different type of group III-V semiconductor material as the n-type semiconductor layer.

The first electrode 411 may be omitted. In case that the first electrode 411 is not present, the first semiconductor layer 431 may be connected to the first electrode portion 351. A side of the first semiconductor layer 431 including the n-type semiconductor layer may be referred to as a cathode, and the first electrode 411 in contact with the first semiconductor layer 431 may be referred to as a cathode electrode.

The second semiconductor layer 432 may include, for example, a p-type semiconductor layer. As an example, in case that the light emitting element LED is a blue light emitting element LED, the p-type semiconductor layer may include a semiconductor material having an empirical formula of $In_xAl_yGa_{1-x-y}N$ ($0 \le x \le 1$, $0 \le y \le 1$, $0 \le x+y \le 1$), for example, at least one of InAlGaN, GaN, AlGaN, InGaN, AlN, and InN. The p-type semiconductor material may be doped with a second conductive dopant (e.g., Mg).

The second electrode 412 may be omitted. In case that the second electrode 412 is not present, the second semiconductor layer 432 may be connected to the second electrode portion 352. A side of the second semiconductor layer 432 including the p-type semiconductor layer may be referred to as an anode, and the second electrode 412 in contact with the second semiconductor layer 432 may be referred to as an anode electrode.

The active layer 450 may have a single or multiple quantum well structure. For example, a clad layer (not illustrated) doped with a conductive dopant may be disposed above or below the active layer 450, and the clad layer (i.e., the clad layer including the conductive dopant) may be an AlGaN layer or an InAlGaN layer. A material such as AlGaN or AlInGaN may be used as the active layer 450. In case that an electric field is applied to the above-described active layer 450, light may be generated by bonding of electron-hole pairs. The position of the active layer 450 may be variously changed according to the type of the light emitting element LED1.

The active layer of the light emitting diode LED having a different color other than the above-described blue light emitting diode LED may include a different type of group III-V semiconductor material.

In an embodiment, although not illustrated, the light emitting diode LED may further include at least one of a phosphor layer, an active layer, a semiconductor layer, and an electrode above or below the first and second semiconductor layers 431 and 432.

The anode (i.e., the second electrode 412 or the second semiconductor layer 432 including the p-type semiconductor layer) of the first light emitting element LED1 may be connected to the second drain electrode of the first driving transistor DT1 and the third drain electrode of the second driving transistor DT2, that is, the second node N2, through the first electrode portion 351 and the first contact electrode 371, and the cathode (i.e., the first electrode 411 or the first semiconductor layer 431 including the n-type semiconductor layer) of the first light emitting element LED1 may be connected to the second power supply line VSL through the connection electrode 340, the second electrode portion 352, and the second contact electrode 372.

The anode (i.e., the second electrode 412 or the second semiconductor layer 432 including the p-type semiconductor layer) of the second light emitting element LED2 may be connected to the second power supply line VSL through the connection electrode 340, the second electrode portion 352, and the second contact electrode 372, and the cathode (i.e., the first electrode 411 or the first semiconductor layer 431 including the n-type semiconductor layer) of the second light emitting element LED2 may be connected to the second drain electrode of the first driving transistor DT1 and the third drain electrode of the second driving transistor DT2, that is, the second node N2, through the first electrode portion 351 and the first contact electrode 371.

Hereinafter, a method of driving the pixel PX according to an embodiment will be described in detail with reference to FIGS. 6, 7, 8 and 9.

Figure 6:
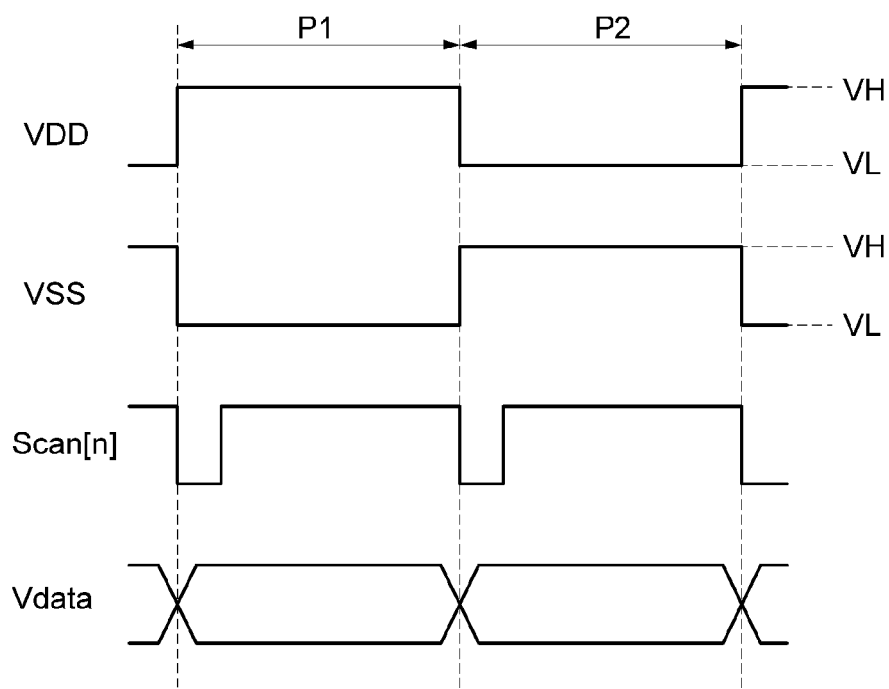
FIG. 6 is a schematic diagram illustrating an embodiment of a timing chart of the circuit diagram of FIG. 2.
Figure 7:
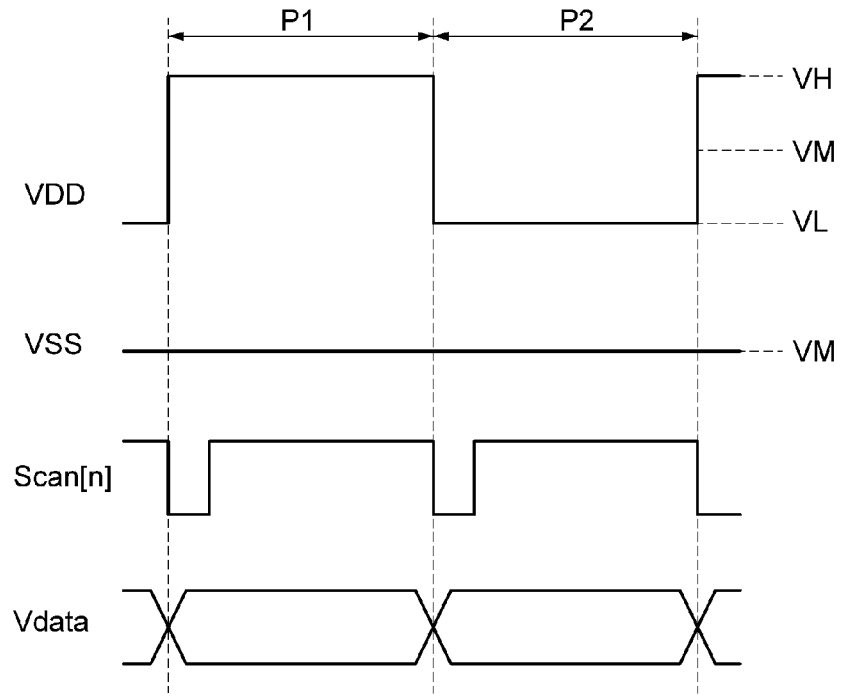
FIG. 7 is a schematic diagram illustrating another embodiment of a timing chart of the circuit diagram of FIG. 2.
Figure 8:
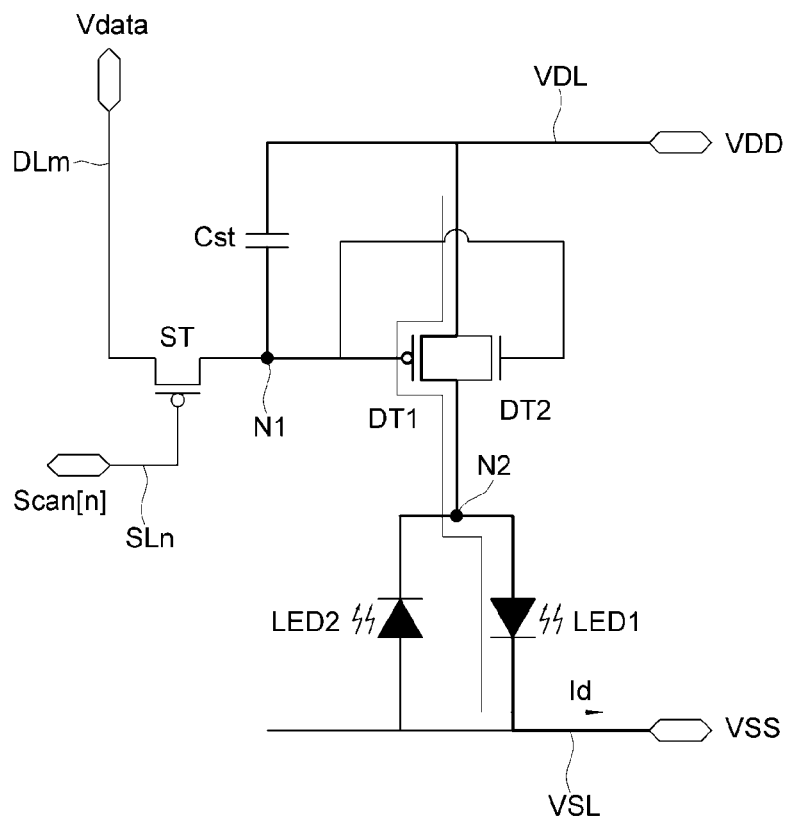
FIG. 8 is a schematic circuit diagram illustrating an equivalent circuit of the circuit diagram of FIG. 2 during a first period.
Figure 9:
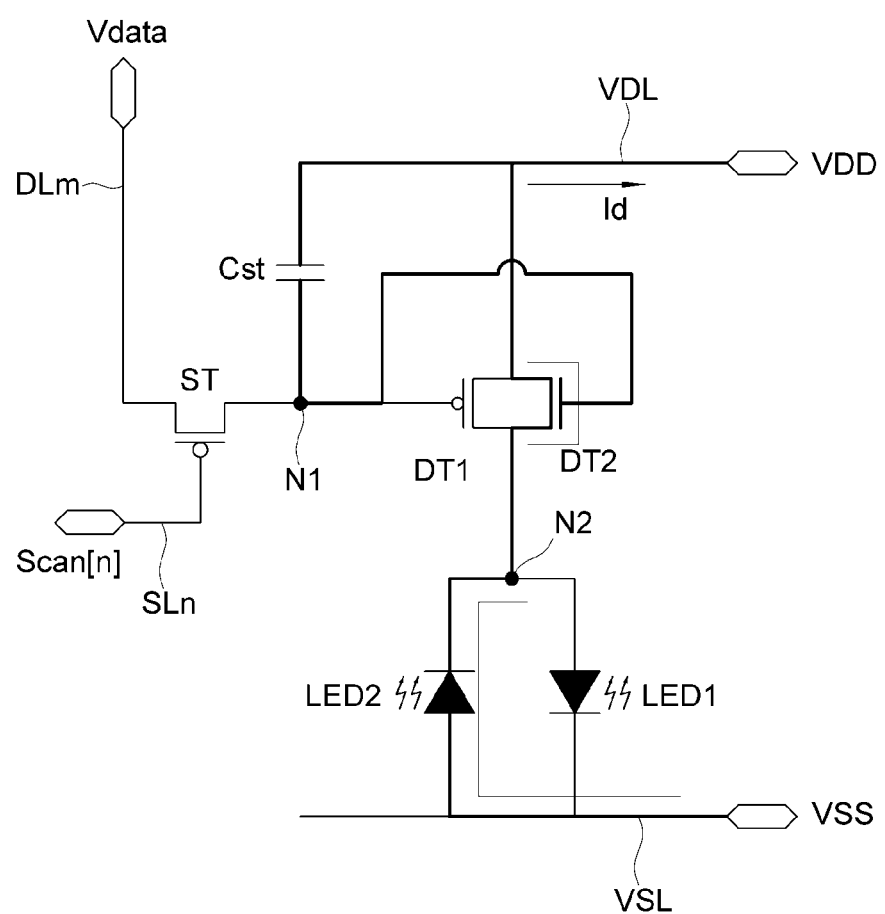
FIG. 9 is a schematic circuit diagram illustrating an equivalent circuit of the circuit diagram of FIG. 2 during a second period.

FIG. 6 is a schematic diagram illustrating an embodiment of a timing chart of the circuit diagram of FIG. 2. FIG. 7 is a schematic diagram illustrating another embodiment of a timing chart of the circuit diagram of FIG. 2. FIG. 8 is a schematic circuit diagram illustrating an equivalent circuit of the circuit diagram of FIG. 2 during a first period. FIG. 9 is a schematic circuit diagram illustrating an equivalent circuit of the circuit diagram of FIG. 2 during a second period.

According to the method of driving the pixel PX according to an embodiment, a first period P1 in which the first light emitting element LED1 emits light and a second period P2 in which the second light emitting element LED2 emits light may be included, and the first period P1 and the second period P2 may be alternately repeated.

Each of the first period P1 and the second period P2 may correspond to at least one frame period. For example, the first period P1 and the second period P2 may correspond to 4 frame periods and 2 frame periods, respectively. Each of the first period P1 and the second period P2 may correspond to a partial period of one frame. For example, the first period P1 and the second period P2 may correspond to a ⅔ frame period and a ⅓ frame period, respectively.

The first period P1 and the second period P2 may be the same as or different from each other. A ratio of the first period P1 and the second period P2 may correspond to a ratio of the number of the first light emitting elements LED1 and the number of the second light emitting elements LED2. For example, in case that the number of the first light emitting elements LED1 included in a pixel PX is n times greater than the number of the second light emitting elements LED2 included in the pixel PX, the first period P1 may be n times longer than the second period P2. For example, if the number of the first light emitting elements LED1 included in the entire pixels PX is n times greater than the number of the second light emitting elements LED2 included in the entire pixels PX, the first period P1 may be n times longer than the second period P2.

During the first period P1, the first driving voltage VDD applied to the first power supply line VDL may be greater than the second driving voltage VSS applied to the second power supply line VSL, and during the second period P2, the first driving voltage VDD applied to the first power supply line VDL during P2 may be less than the second driving voltage VSS applied to the second power supply line VSL.

Referring to FIG. 6, in case entering the first period P1 from second period P2, the first driving voltage VDD may be changed from a low-level voltage VL to a high-level voltage VH, and the second driving voltage VSS may be changed from the high-level voltage VH to the low-level voltage VL. During the first period P1, the first driving voltage VDD may be maintained as the high-level voltage VH, and the second driving voltage VSS may be maintained as the low-level voltage VL.

In case entering the second period P2 from the first period P1, the first driving voltage VDD may be changed from the high-level voltage VH to the low-level voltage VL, and the second driving voltage VSS may be changed from the low-level voltage VL to the high-level voltage VH. During the second period P2, the first driving voltage VDD may be maintained as the low-level voltage VL and the second driving voltage VSS may be maintained as the high-level voltage VH. The voltage VL may be less than the voltage VH.

The timing of entering the first period P1 from the second period P2 and the timing of entering the first period P1 from the second period P2 may be synchronized with the timing in case that a current scan signal Scan[n] (e.g., a scan signal at a current time) is applied.

Referring to FIG. 7, the second driving voltage VSS may be fixed to an intermediate-level voltage VM, and the first driving voltage VDD may be alternated between the low-level voltage VL and the high-level voltage VH. The low-level voltage VL may be less than the intermediate-level voltage VM, and the intermediate-level voltage VM may be less than the high-level voltage VH. For example, in case entering the first period P1 from the second period P2, the first driving voltage VDD may be changed to the high-level voltage VH from the low-level voltage VL, and in case entering the second period P2 from the first period P1, the first driving voltage VDD may be changed to the low-level voltage VL from the high-level voltage VH. The second driving voltage VSS may maintain the intermediate-level voltage VM during the first period P1 and the second period P2.

However, embodiments of the disclosure are not limited thereto, and the first driving voltage VDD may be fixed to the intermediate-level voltage VM, and the second driving voltage VSS may be alternated between the low-level voltage VL and the high-level voltage VH.

Hereinafter, an operation of the pixel PX during the first period P1 will be described with reference to FIGS. 6 and 8.

Referring to FIG. 6, the current scan signal Scan[n] applied to a corresponding scan line SLn among the scan lines SL1-SLi may be applied to the gate of the switching transistor ST, and the data voltage Vdata applied to a corresponding data line DLm among the data lines DL1 to DLj may be applied to the source of the switching transistor ST. The switching transistor ST may be a P-type or N-type transistor. Hereinafter, the switching transistor ST will be described with respect to a P-type transistor.

The scan line SLn to be driven at a current time may be an n-th scan line SLn and the scan signal applied to the n-th scan line SLn is Scan[n], and the scan line driven prior to the current scan line may be an (n−1)-th scan line SLn−1 and the scan signal applied to the (n−1)-th scan line may be Scan [n−1].

First, in case that the current scan signal Scan[n] is applied, that is, in case that the current scan signal Scan[n] at a low level is applied, the switching transistor ST, which may be a p-type transistor, may be turned on, and the data voltage Vdata applied to the data line DLm may be transmitted to the first node N1 (the gate of the first driving transistor DT1, the gate of the second driving transistor DT2, and an end of the storage capacitor) through the switching transistor ST.

The storage capacitor Cst may be charged according to the data voltage Vdata transmitted to the first node N1 and may store the charged data voltage Vdata during the first period P1. Accordingly, the first node N1 (the gates of the first driving transistor DT1 and the second driving transistor DT2) may maintain the transmitted data voltage Vdata during the first period P1.

The data voltage Vdata stored in the storage capacitor Cst may be applied to the gates of the first driving transistor DT1 and the second driving transistor DT2. As described above, in an embodiment, the first driving transistor DT1 may be a P-type transistor, and the second driving transistor DT2 may be an N-type transistor.

The voltage VCst stored in the storage capacitor Cst, that is, a voltage difference Vgs1 between a gate voltage Vg1 and a source voltage Vs1 of the first driving transistor DT1, may be substantially equal to a difference between the data voltage Vdata, which may be a voltage of the first node N1 connected to the gate, and the first driving voltage VDD applied to the first power supply line VDL connected to the source. During the first period P1, the first driving voltage VDD may be a high-level voltage VH. In order to turn on the first driving transistor DT1, Vgs1 of the first driving transistor DT1 may be less than a threshold voltage $-V_{th1}$ ($V_{th1}$ being a positive value) of the first driving transistor DT1 which is a p-type transistor.

$$VCst = Vgs1 = Vg1 - Vs1 = Vdata - VH < -Vth1$$

$$Vdata < -Vth1 + VH \quad \text{(Equation 1)}$$

In an embodiment, the first driving transistor DT1 may operate in a saturation region. Accordingly, a voltage Vd1 of the drain of the first driving transistor DT1 connected to the second node N2 may be less than a voltage which is greater than the gate voltage Vg1 by Vth1.

$$Vd1 < Vg1 + Vth1 = Vdata + Vth1$$

$$-Vth1 + Vd1 < Vdata \quad \text{(Equation 2)}$$

However, embodiments of the disclosure are not limited thereto, and the first driving transistor DT1 may operate in a triode region.

Since the second node N2 may be connected to the second power supply line VSL through the first light emitting element LED1 connected in the forward direction, the drain voltage Vd1 of the first driving transistor DT1 connected to the second node N2 may have a level (e.g., voltage level, amplitude, etc.) of approximately the low-level voltage VL. More precisely, the voltage of the second node N2 may be greater than the low-level voltage VL of the second power supply line VSL by a voltage drop VLED (VLED being a positive value) of the first light emitting element LED1.

$$-Vth1 + (VL + \text{VLED}) < Vdata \quad \text{(Equation 3)}$$

Accordingly, in an embodiment, in order to turn on and operate the first driving transistor DT1 in the saturation region, the data voltage Vdata transmitted to the gate of the first driving transistor DT1 may have a voltage level satisfying the following range.

$$-Vth1 + (VL + \text{VLED}) < Vdata < -Vth1 + VH \quad \text{(Equation 4)}$$

In an embodiment, as described above, the data voltage Vdata stored in the storage capacitor Cst may also be applied to the gate of the N-type second driving transistor DT2. In contrast to the P-type transistor, in the N-type transistor, a terminal to which a high-level voltage may be applied may be referred to as a drain, and a terminal to which a low-level voltage may be applied may be referred to as a source, and in the case of the second driving transistor DT2 in the first period P1, the terminal connected to the first power supply line VDL may be referred to as a drain, and the terminal connected to the second node N2 may be referred to as a source.

In an embodiment, in the first period P1, the second driving transistor DT2 may be turned off. Accordingly, a difference Vgs2 between a gate voltage Vg2 and a source voltage Vs2 of the second driving transistor DT2 may be less than a threshold voltage Vth2 (Vth2 being a positive value) of the second driving transistor DT2 which may be an N-type transistor.

$$Vgs2 = Vg2 - Vs2 = Vdata - (VL + \text{VLED}) < Vth2$$

$$Vdata < Vth2 + (VL + \text{VLED}) \quad \text{(Equation 5)}$$

Accordingly, in order to turn on the first driving transistor DT1 in the saturation region and turn off the second driving transistor DT2 during the first period P1, the data voltage Vdata transmitted to the first node N1 may have a range satisfying both of Equation 3 and Equation 4.

In order to turn off both the first driving transistor DT1 and the second driving transistor DT2 during the first period P1, the data voltage Vdata transmitted to the first node N1 may have the following range.

$$-Vth1 + VH < Vdata < Vth2 + (VL + \text{VLED}) \quad \text{(Equation 6)}$$

Accordingly, in order to turn off both the first driving transistor DT1 and the second driving transistor DT2, it may be necessary that the following condition be satisfied.

$$-Vth1 + VH < Vth2 + (VL + \text{VLED})$$

Referring to FIG. 8, during the first period P1, a driving current Id may flow from the source to the drain of the first driving transistor DT1, and a magnitude of the driving current may be determined based on the data voltage Vdata applied to the gate of the first driving transistor DT1. The driving current may flow through one or more first light emitting elements LED1 which may be forward biased among the light emitting diodes LED connected in parallel between the second node N2 and the second power supply line VSL. Accordingly, the first light emitting element LED1 may emit light by the driving current Id, and the reverse-biased second light emitting element LED2 may not emit light.

In an embodiment, as illustrated in the timing chart illustrated in FIG. 7, in the first period P1, the high-level voltage VH may be applied to the first power supply line VDL, and the intermediate-level voltage VM may be applied to the second power supply line VSL. In such an embodiment, the operation of the pixel PX may be substantially the same as those described above except that the second driving voltage VSS applied to the second power supply line VSL in Equations 1 to 6 may be replaced with VM instead of VL.

Hereinafter, the operation of the pixel PX during the second period P2 will be described with reference to FIGS. 6 and 9.

As in the first period P1, in case that the current scan signal Scan[n] is applied, that is, in case that the current scan signal Scan[n] at a low level is applied, the switching transistor ST, which may be a p-type transistor, may be turned on, and the data voltage Vdata applied to the data line DLm may be transmitted to the first node N1 through the switching transistor ST.

The data voltage Vdata stored in the storage capacitor Cst may be applied to the gates of the first driving transistor DT1 and the second driving transistor DT2. In an embodiment, in contrast to the first period P1, in the second period P2, the low-level voltage VL may be applied to the first power supply line VDL and the high-level voltage VH may be applied to the second power supply line VSL.

In the case of the second driving transistor DT2 which may be an N-type, in the second period P2, a terminal connected to the first power supply line VDL to which the low-level voltage VL may be applied may be referred to as a source, and a terminal connected to the second node N2 to which the high-level voltage VH (more precisely, VH-VLED) may be applied may be referred to as a drain.

The voltage VCst stored in the storage capacitor Cst, that is, a voltage difference Vgs2 between a gate voltage Vg2 and a source voltage Vs2 of the second driving transistor DT2 may be substantially equal to a difference between the data voltage Vdata which may be a voltage of the first node N1 connected to the gate, and the first driving voltage VDD applied to the first power supply line VDL connected to the source. During the second period P2, the first driving voltage VDD may be the low-level voltage VL. In an embodiment, Vgs2 of the second driving transistor DT2 may be greater than a threshold voltage Vth2 (Vth2 being a positive value) of the second driving transistor DT2 which may be an N-type transistor.

$$VCst=Vgs2=Vg2-Vs2=V\text{data}-VL>Vth2$$

$$V\text{data}>Vth2+VL \quad \text{(Equation 7)}$$

In an embodiment, the second driving transistor DT2 may operate in a saturation region. Accordingly, the drain voltage Vd2 of the second driving transistor DT2 connected to the second node N2 may be greater than a voltage less than the gate voltage Vg2 by Vth2.

$$Vd2>Vg2-Vth2=V\text{data}-Vth2$$

$$Vth2+Vd2>V\text{data} \quad \text{(Equation 8)}$$

However, embodiments of the disclosure are not limited thereto, and the first driving transistor DT1 may operate in the triode region.

Since the second node N2 may be connected to the second power supply line VSL through the second light emitting element LED2 connected in the reverse direction, the drain voltage Vd2 of the second driving transistor DT2 connected to the second node N2 may have a level of approximately the high-level voltage VH. More precisely, the voltage of the second node N2 may be less than the high-level voltage VH of the second power supply line VSL by a voltage drop VLED of the second light emitting element LED2 (VLED being a positive value).

$$Vth1+(VH-\text{VLED})>V\text{data} \quad \text{(Equation 9)}$$

Accordingly, in an embodiment, in order to turn on and operate the second driving transistor DT2 in the saturation region, the data voltage Vdata transmitted to the gate of the second driving transistor DT2 may have a voltage level satisfying the following range.

$$Vth2+(VH-\text{VLED})>V\text{data}>Vth2+VL \quad \text{(Equation 10)}$$

In an embodiment, as described above, the data voltage Vdata stored in the storage capacitor Cst may also be applied to the gate of the first driving transistor DT1 which is a P-type. In contrast to the N-type transistor, in the P-type transistor, a terminal to which a high-level voltage may be applied may be referred to as a source and a terminal to which a low-level voltage may be applied may be referred to as a drain, and in the case of the first driving transistor DT1 in the second period P2, the terminal connected to the first power supply line VDL may be referred to as a drain, and the terminal connected to the second node N2 may be referred to as a source.

In an embodiment, in the second period P2, the first driving transistor DT1 may be turned off. Accordingly, the difference Vgs1 between the gate voltage Vg1 and the source voltage Vs1 of the first driving transistor DT1 may be greater than the threshold voltage−Vth1 (Vth1 being a positive value) of the first driving transistor DT1 which may be a P-type transistor.

$$Vgs1=Vg1-Vs1=V\text{data}-(VH-\text{VLED})>-Vth1$$

$$V\text{data}>-Vth1+(VH-\text{VLED}) \quad \text{(Equation 11)}$$

Accordingly, in order to turn on the second driving transistor DT2 in the saturation region and turn off the first driving transistor DT1 during the second period P2, the data voltage Vdata transmitted to the first node N1 may have a range that satisfies both of Equation 9 and Equation 10.

In order to turn off both the first driving transistor DT1 and the second driving transistor DT2 during the second period P2, the data voltage Vdata transmitted to the first node N1 may have the following range.

$$Vth2+VL>V\text{data}>-Vth1+(VH-\text{VLED}) \quad \text{(Equation 12)}$$

Accordingly, in order to turn off both the first driving transistor DT1 and the second driving transistor DT2, it may be necessary that the following condition be satisfied.

$$Vth2+VL>-Vth1+(VH-\text{VLED})$$

During the second period P2, the driving current Id may flow in a direction from the drain to the source of the second driving transistor DT2, and the magnitude of the driving current may be determined based on the data voltage Vdata applied to the gate of the second driving transistor DT2. The driving current may flow through one or more second light emitting elements LED2 which may be forward biased among the light emitting diodes LED connected in parallel between the second node N2 and the second power supply line VSL. Accordingly, the second light emitting element LED2 emits light by the driving current Id, and the reverse-biased first light emitting element LED1 may not emit light.

In an embodiment, as illustrated in the timing chart illustrated in FIG. 7, in the second period P2, the low-level voltage VL may be applied to the first power supply line VDL and the intermediate-level voltage VM may be applied to the second power supply line VSL. In such an embodiment, the operation of the pixel PX may be substantially the same as that described above except that the second driving voltage VSS applied to the second power supply line VSL in Equations 7 to 12 may be replaced with VM instead of VH.

Figure 10:
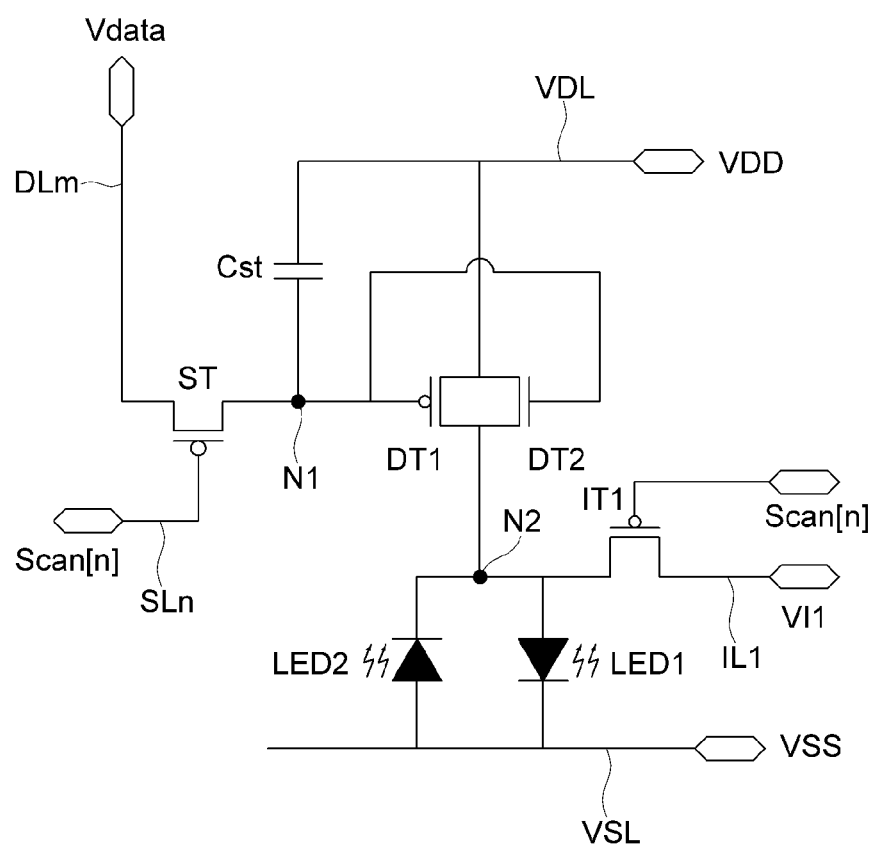
FIG. 10 is a schematic circuit diagram illustrating a circuit further including a light emitting diode initialization circuit according to an embodiment.

FIG. 10 is a schematic circuit diagram illustrating a circuit further including a light emitting diode initialization circuit according to an embodiment.

A pixel circuit of FIG. 10 may further include a light emitting element initialization circuit connected to the second node N2. Since the configuration except for the initialization circuit may be substantially the same as the circuit of the pixel described with reference to FIG. 2, a detailed description thereof will be omitted.

The light emitting element initialization circuit may include an initialization power line ILL the scan line SLn, and an initialization transistor IT1 connected to the second node N2.

The initialization transistor IT1 may include a gate electrode connected to the n-th scan line SLn and may be connected between the initialization power line IL1 and the second node N2. One of a source electrode and a drain electrode of the initialization transistor IT1 may be connected to the initialization power line ILL and the other of the source electrode and the drain electrode may be connected to the second node N2. For example, the source electrode of the initialization transistor IT1 may be connected to the initialization power line ILL and the drain electrode of the initialization transistor IT1 may be connected to the second node N2. The initialization transistor IT1 may be a P-type or N-type transistor. The power supply may apply an initialization voltage VI1 to the initialization power line ILL The initialization voltage VI1 may be substantially equal to the second driving voltage VSS applied to the second power supply line VSL. The initialization voltage VI1 may be different from the second driving voltage VSS applied to the second power supply line VSL.

Hereinafter, the operation of the pixel PX illustrated in FIG. 10 will be described.

As described above, the anode ANO of the first light emitting element LED1 and the cathode CAT of the second light emitting element LED2 may be connected to the second node N2, and the cathode CAT of the first light emitting element LED1 and the anode ANO of the second light emitting element LED2 may be connected to the second power supply line VSL. Accordingly, during the first period P1, the first light emitting element LED1 may be forward biased to emit light, and the second light emitting element LED2 may be reverse biased such that charges may be accumulated across opposite ends of the diode as in a capacitor. In contrast, during the second period P2, the second light emitting element LED2 may be forward biased to emit light, and the first light emitting element LED1 may be reverse biased such that charges may be accumulated across opposite ends of the diode as in a capacitor.

First, during the second period P2, the second light emitting element LED2 may be forward biased to emit light, and the first light emitting element LED1 may be reverse biased such that charges may be accumulated across opposite ends of the diode as in a capacitor.

In case that the current scan signal Scan[n] of a low-level is applied to the gate of the switching transistor ST upon start of the first period P1, the switching transistor ST may be turned on and data voltage Vdata may be transmitted to the storage capacitor Cst.

At substantially the same time as the above, in case that the current scan signal Scan[n] of a low level may be applied to the gate of the initialization transistor IT1, the initialization transistor IT1 may be turned on, and the initialization voltage applied to the initialization power line IL1 may be applied to the second node N2 through the initialization transistor IT1. Accordingly, the charges accumulated in the first light emitting element LED1 may be discharged through the initialization transistor IT1. In such an embodiment, the initialization voltage applied to the initialization power line IL1 may be substantially equal to or higher than the second driving voltage VSS applied to the second power supply line VSL. For example, the initialization voltage may be higher than VL.

In case that the scan signal Scan[n] is changed to the high-level again, the initialization transistor IT1 may be turned off during the remaining first period P1, and the first light emitting element LED1 may be driven by the driving current Id output from the first driving transistor DT1. During the remaining first period P1, the second light emitting element LED2 may be reverse biased such that charges may be accumulated across opposite ends thereof.

Similarly, in case that the current scan signal Scan[n] of a low-level is applied to the gate of the switching transistor ST upon start of the second period P2, the switching transistor ST may be turned on and the data voltage Vdata may be applied to the storage capacitor Cst.

At substantially the same time as the above, the initialization transistor IT1 may be turned on, and the initialization voltage applied to the initialization power line IL1 may be transmitted to the second node N2 through the initialization transistor IT1. Accordingly, upon start of the second period P2, the charges accumulated in the second light emitting element LED2 may be discharged through the initialization transistor IT1. In such an embodiment, the initialization voltage applied to the initialization power line IL1 may be substantially equal to or lower than the second driving voltage VSS applied to the second power supply line VSL. For example, the initialization voltage may be lower than VH.

In case that the scan signal Scan[n] is changed to the high-level again, the initialization transistor IT1 may be turned off during the remaining second period P2 and the second light emitting element LED2 may be driven by the driving current Id output from the second driving transistor DT2. During the remaining second period P2, the first light emitting element LED1 may be reverse biased such that charges may be accumulated across opposite ends thereof.

In an embodiment, although it has been described that both the initialization transistor IT1 and the switching transistor ST may be turned on by the same current scan signal Scan[n], embodiments of the disclosure are not limited thereto. The initialization transistor IT1 may be turned on before the switching transistor ST may be turned on and may be turned off simultaneously with or prior to the switching transistor ST being turned on. For example, the gate of the initialization transistor IT1 may be connected to the scan line SLn−1 and a previous scan signal Scan[n−1] may be applied thereto.

Figure 11:
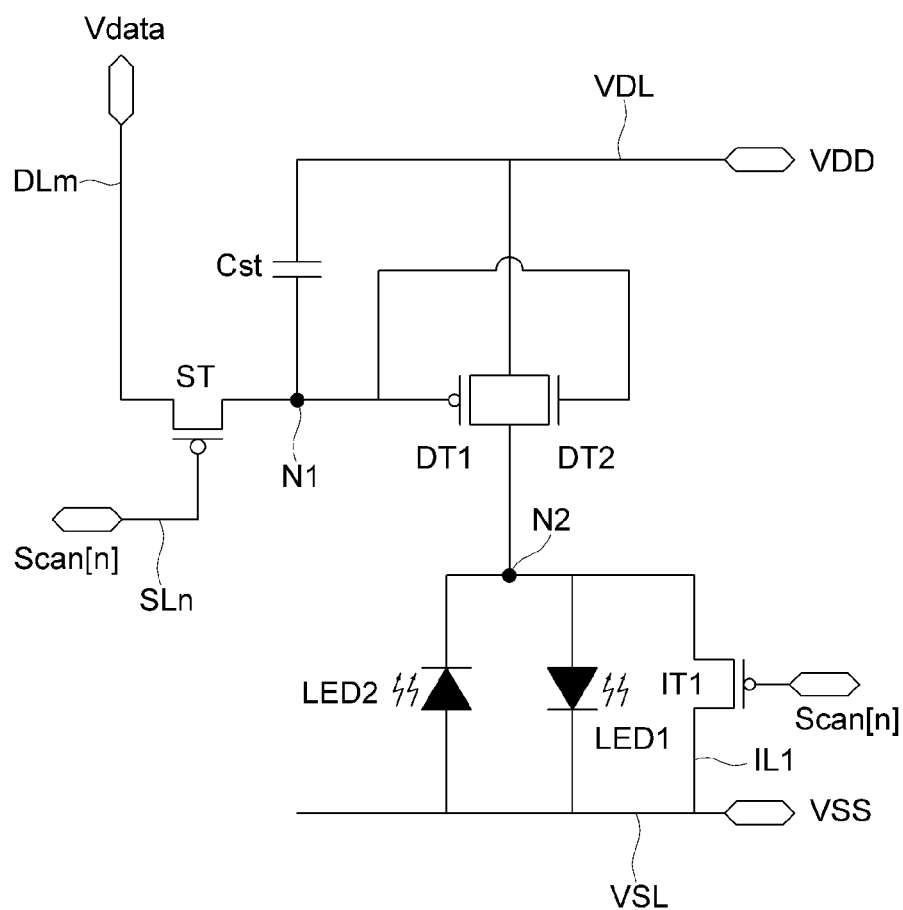
FIG. 11 is a schematic circuit diagram illustrating a circuit further including a light emitting diode initialization circuit according to another embodiment.

FIG. 11 is a schematic circuit diagram illustrating a circuit further including a light emitting diode initialization circuit according to another embodiment.

A pixel PX circuit according to FIG. 11 may have substantially the same configuration as the pixel PX described with reference to FIG. 10 except that the initialization transistor IT1 may be connected to the second power supply line VSL.

The light emitting element initialization circuit may include the second power supply line VSL, the scan line SLn, and the initialization transistor IT1 connected to the second node N2.

The initialization transistor IT1 may include a gate electrode connected to the n-th scan line SLn and may be connected between the second power supply line VSL and the second node N2. One of a source electrode and a drain electrode of the initialization transistor IT1 may be connected to the second power supply line VSL, and the other of the source electrode and the drain electrode may be connected to the second node N2. For example, the source electrode of the initialization transistor IT1 may be connected to the second power supply line VSL, and the drain electrode of the initialization transistor IT1 may be connected to the second node N2.

In case that the initialization transistor IT1 is turned on according to the current scan signal Scan[n] upon start of the first period P1, the second driving voltage VSS applied to the second power supply line VSL may be transmitted to the second node N2 through the initialization transistor IT1. Accordingly, substantially the same voltage may be applied to opposite ends of the first light emitting element LED1 such that the charges accumulated in the first light emitting element LED1 during the second period P2 may be discharged.

Similarly, in case that the initialization transistor IT1 is turned on according to the current scan signal Scan[n] upon start of the second period P2, substantially the same voltage may be applied to opposite ends of the second light emitting element LED2 such that the charges accumulated in the second light emitting element LED2 during the first period P1 may be discharged.

Figure 12:
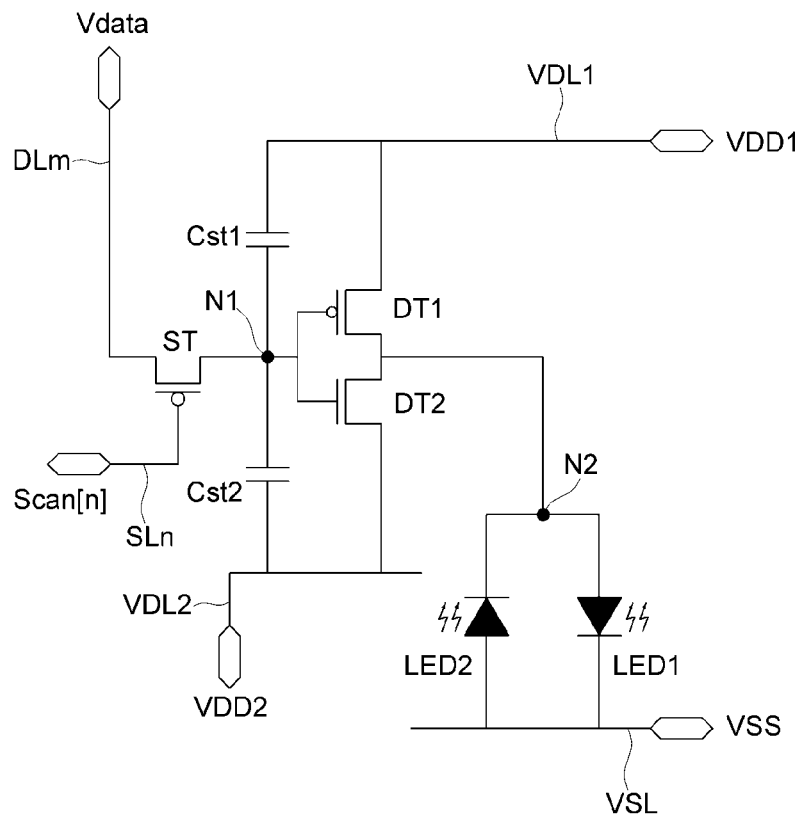
FIG. 12 is a schematic circuit diagram illustrating a circuit provided in a pixel according to another embodiment.

FIG. 12 is a schematic circuit diagram illustrating a circuit provided in a pixel according to another embodiment.

A pixel circuit may include a switching circuit which transmits a data voltage Vdata applied to a data line DLm, a storage circuit which stores the transmitted data voltage Vdata, and a driving circuit which controls a current for driving an LED according to the stored data voltage Vdata.

The switching circuit may include the data line DLm, a scan line SLn, and a switching transistor ST connected to a first node N1. The storage circuit may include a first storage capacitor Cst1 connected to the first node N1 and a (1-1)-st power supply line VDL1, and a second storage capacitor Cst2 connected to the first node N1 and a (1-2)-nd power supply line VDL2. The driving circuit may include a first driving transistor DT1 connected to the first node N1, the (1-1)-st power supply line VDL1, and a second node N2, and a second driving transistor DT2 connected to the first node N1, the (1-2)-nd power supply line VDL2 and the second node N2. The first driving transistor DT1 and the second driving transistor DT2 may be complementary to each other.

The light emitting element LED may include a nano-sized ultra-small light emitting diode LED. The light emitting diode LED may include at least two light emitting diodes LED which may be each connected to the second node N2 and a second power supply line VSL and biased in opposite directions. The light emitting diode LED may include a first light emitting element LED1 and a second light emitting element LED2. An anode of the first light emitting element LED1 and a cathode of the second light emitting element LED2 may be connected to the second node N2, and a cathode of the first light emitting element LED1 and an anode of the second light emitting element LED2 may be connected to the (1-2)-nd power supply line VDL2.

The power supply may include a first power supply which supplies a first driving voltage VDD1 to the (1-1)-st power supply line VDL1, a (1-2)-nd power supply which supplies a (1-2)-nd driving voltage VDD2 to the (1-2)-nd power supply line VDL2, and a third power supply which supplies a second driving voltage VSS to the second power supply line VSL.

According to the first driving voltage VDD1, the (1-2)-nd driving voltage VDD2, the second driving voltage VSS and the data voltage Vdata of the first node N1, the first light emitting element LED1 and the second light emitting element LED2 may alternately emit light.

Hereinafter, a connection relationship between each transistor and each light emitting diode will be described in detail with reference to FIG. 12.

The switching transistor ST may include a first gate electrode connected to an n-th scan line SLn and may be connected between an m-th data line DLm and the first node N1. One of a first source electrode and a first drain electrode of the switching transistor ST may be connected to the m-th data line DLm, and the other of the first source electrode and the first drain electrode may be connected to the first node N1. For example, the first source electrode of the switching transistor ST may be connected to the m-th data line DLm, and the first drain electrode of the switching transistor ST may be connected to the first node N1. The switching transistor ST may be a P-type or N-type transistor. The switching transistor ST may be a PMOS or NMOS transistor.

The first driving transistor DT1 may include a second gate electrode connected to the first node N1 and may be connected between the (1-1)-st power supply line VDL1 and the second node N2. In an embodiment, the first driving transistor DT1 may be a P-type transistor or a PMOS transistor. One of a second source electrode and a second drain electrode of the first driving transistor DT1 may be connected to the (1-1)-st power supply line VDL1, and the other of the second source electrode and the second drain electrode may be connected to the second node N2. For example, the second source electrode of the first driving transistor DT1 may be connected to the (1-1)-st power supply line VDL1, and the second drain electrode of the first driving transistor DT1 may be connected to the second node N2. The first driving transistor DT1 may control a magnitude of a current flowing from the first power supply line to the second node N2 (current flowing from the second source electrode to the second drain electrode) according to the data voltage Vdata applied to the second gate electrode.

The second driving transistor DT2 may include a third gate electrode connected to the first node N1 and may be connected between the (1-2)-nd power supply line VDL2 and the second node N2. In an embodiment, the second driving transistor DT2 may be an N-type transistor or an NMOS transistor. In an embodiment, the first driving transistor DT1 and the second driving transistor DT2 may be mutually complementary transistors, for example, CMOS transistor. One of a third source electrode and a third drain electrode of the second driving transistor DT2 may be connected to the (1-2)-nd power supply line VDL2, and the other of the third source electrode and the third drain electrode may be connected to the second node N2. For example, the third source electrode of the second driving transistor DT2 may be connected to the (1-2)-nd power supply line VDL2, and the third drain electrode of the second driving transistor DT2 may be connected to the second node N2. The second driving transistor DT2 controls a magnitude of a current flowing from the second node N2 to the second power supply line (current flowing from the third drain electrode to the third source electrode) according to the data voltage Vdata applied to the third gate electrode.

The first storage capacitor Cst1 may be connected between the first node N1 and the (1-1)-st power supply line VDL1. The second storage capacitor Cst2 may be connected between the first node N1 and the (1-2)-nd power supply line VDL2. The first storage capacitor Cst1 and the second storage capacitor Cst2 may store the data voltage Vdata applied to the first node N1 for one frame or a partial period of one frame.

Hereinafter, a method of driving the pixel PX according to an embodiment will be described in detail with reference to FIGS. 12, 13, 14 and 15.

Figure 13:
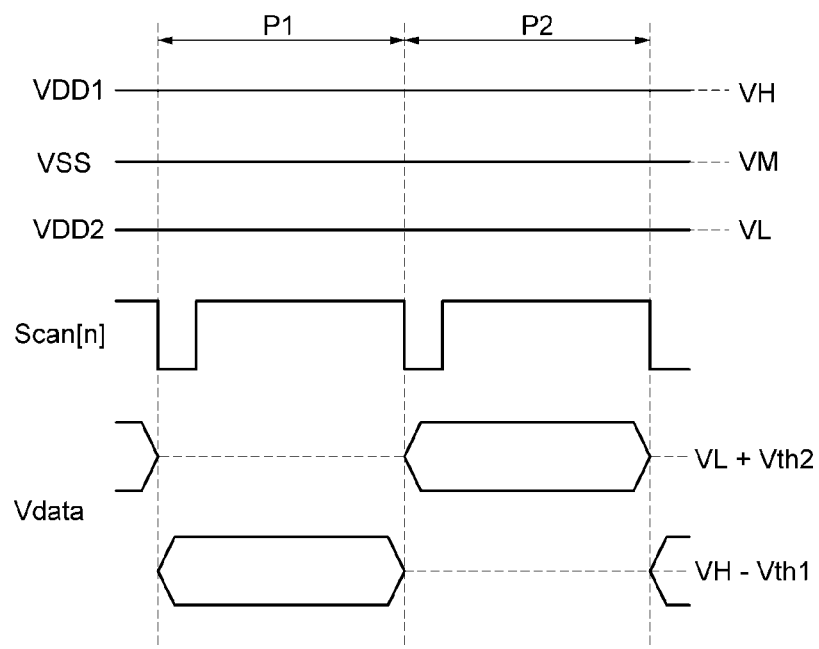
FIG. 13 is a schematic diagram illustrating an embodiment of a timing chart of the circuit diagram of FIG. 12.
Figure 14:
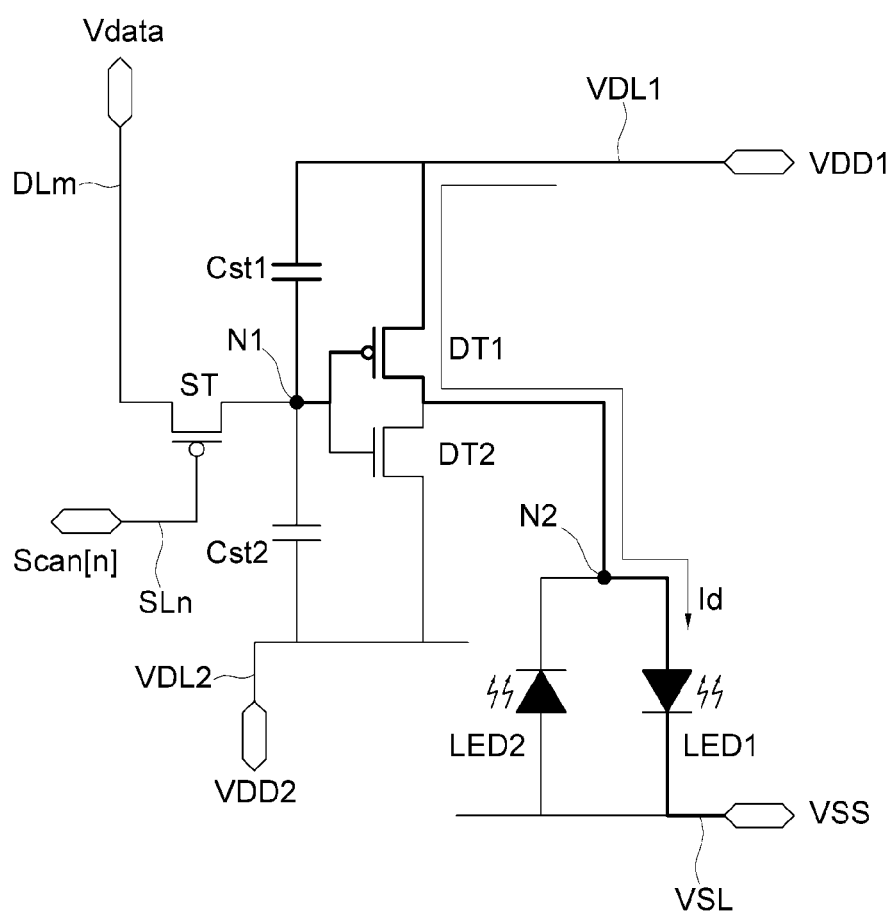
FIG. 14 is a schematic circuit diagram illustrating an equivalent circuit of the circuit diagram of FIG. 12 during a first period.
Figure 15:
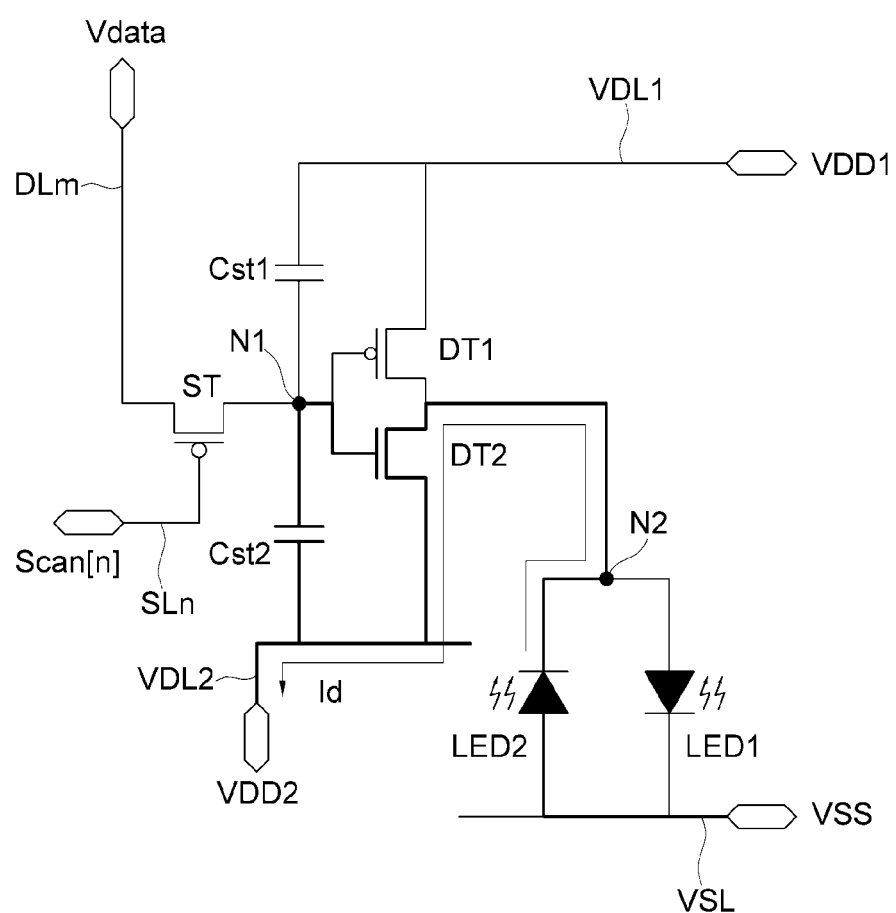
FIG. 15 is a schematic circuit diagram illustrating an equivalent circuit of the circuit diagram of FIG. 12 during a second period.

FIG. 13 is a schematic diagram illustrating an embodiment of a timing chart of the circuit diagram of FIG. 12. FIG. 14 is a schematic circuit diagram illustrating an equivalent circuit of the circuit diagram of FIG. 12 during a first period. FIG. 15 is a schematic circuit diagram illustrating an equivalent circuit of the circuit diagram of FIG. 12 during a second period.

As described above, according to the method of driving the pixel PX according to an embodiment, a first period P1 in which the first light emitting element LED1 emits light and a second period P2 in which the second light emitting element LED2 emits light may be included, and the first period P1 and the second period P2 may be alternately repeated.

The (1-1)-st driving voltage VDD1 applied to the (1-1)-st power supply line VDL1, the (1-2)-nd driving voltage VDD2 applied to the (1-2)-nd power supply line VDL2, and the second driving voltage VSS applied to the second power supply line VSL may have substantially the same value during the first period P1 and the second period P2. For example, the (1-1)-st driving voltage VDD1 may be higher than the second driving voltage VSS, and the (1-2)-nd driving voltage VDD2 may be lower than the second driving voltage VSS. For example, the (1-1)-st driving voltage VDD1 may be a high-level voltage VH, the (1-2)-nd driving voltage VDD2 may be a low-level voltage VL, and the second driving voltage VSS may be an intermediate-level voltage VM.

Hereinafter, the operation of the pixel PX during the first period P1 will be described with reference to FIGS. 12, 13, and 14.

Referring to FIG. 12, a current scan signal Scan[n] applied to the corresponding scan line SLn among the scan lines SL1-SLi may be applied to the gate of the switching transistor ST, and the data voltage Vdata applied to a corresponding data line DLm among the data lines DL1 to DLj may be applied to the source of the switching transistor ST. The switching transistor ST may be a p-type or n-type transistor. Hereinafter, the switching transistor ST will be described with respect to a p-type transistor.

First, in case that the current scan signal Scan[n] is applied, that is, in case that the current scan signal Scan[n] at a low level is applied, the switching transistor ST, which may be a p-type transistor, may be turned on, and the data voltage Vdata applied to the data line DLm may be transmitted to the first node N1 (the gate of the first driving transistor DT1, the gate of the second driving transistor DT2, an end of the first storage capacitor Cst1, and an end of the second storage capacitor Cst2) through the switching transistor ST.

The first storage capacitor Cst1 and the second storage capacitor Cst2 may be charged according to the data voltage Vdata transmitted to the first node N1 and store the data voltage Vdata during the first period P1. Accordingly, the first node N1 maintains the transmitted data voltage Vdata during the first period P1.

The data voltage Vdata stored in the storage capacitor Cst may be applied to the gates of the first driving transistor DT1 and the second driving transistor DT2. As described above, in an embodiment, the first driving transistor DT1 may be a P-type transistor, and the second driving transistor DT2 may be an N-type transistor.

The voltage VCst stored in the first storage capacitor Cst1, that is, a voltage difference Vgs1 between a gate voltage Vg1 and a source voltage Vs1 of the first driving transistor DT1, may be substantially equal to a difference between the data voltage Vdata, which may be a voltage of the first node N1 connected to the gate, and the (1-1)-st driving voltage VDD1 applied to the (1-1)-st power supply line VDL1 connected to the source.

During the first period P1, the first driving transistor DT1 may be turned on and the second driving transistor DT2 may be turned off.

In order to turn on the first driving transistor DT1, Vgs1 of the first driving transistor DT1 may be less than a threshold voltage−Vth1 (Vth1 being a positive value) of the first driving transistor DT1 which may be a p-type transistor.

$$VCst = Vgs1 = Vg1 - Vs1 = Vdata - VH < -Vth1$$

$$Vdata < -Vth1 + VH \quad \text{(Equation 13)}$$

In order to turn off the second driving transistor DT2, a difference Vgs2 between a gate voltage Vg2 and a source voltage Vs2 of the second driving transistor DT2 may be less than a threshold voltage Vth2 (Vth2 being a positive value) of the second driving transistor DT2 which may be an N-type transistor.

$$Vgs2 = Vg2 - Vs2 = Vdata - VL < Vth2$$

$$Vdata < Vth2 + VL \quad \text{(Equation 14)}$$

Accordingly, in order to turn on the first driving transistor DT1 and turn off the second driving transistor DT2 during the first period P1, the data voltage Vdata transmitted to the first node N1 may have a range satisfying both of Equation 13 and Equation 14.

During the first period P1, a driving current Id may flow in a direction from the source to the drain of the first driving transistor DT1, and a magnitude of the driving current Id may be determined based on the voltage stored in the first storage capacitor Cst1. The driving current Id may flow through one or more first light emitting elements LED1 which may be forward biased among the light emitting diodes LED connected in parallel between the second node N2 and the second power supply line VSL. Accordingly, the first light emitting element LED1 may emit light by the driving current, and the reverse-biased second light emitting element LED2 may not emit light.

Hereinafter, the operation of the pixel PX during the second period P2 will be described with reference to FIGS. 12, 13, and 15.

During the second period P2, the first driving transistor DT1 may be turned off and the second driving transistor DT2 may be turned on.

In order to turn on the second driving transistor DT2, Vgs2 of the second driving transistor DT2 may be higher than a threshold voltage Vth2 (Vth2 being a positive value) of the second driving transistor DT2 which may be an N-type transistor.

$$VCst = Vgs2 = Vg2 - Vs2 = Vdata - VL > Vth2$$

$$Vdata > Vth2 + VL \quad \text{(Equation 15)}$$

In order to turn off the first driving transistor DT1, the difference Vgs1 between the gate voltage Vg1 and the source voltage Vs1 of the first driving transistor DT1 may be higher than a threshold voltage−Vth1 (Vth1 being a positive value) of the first driving transistor DT1 which may be a P-type transistor.

$$Vgs1 = Vg1 - Vs1 = Vdata - VH > -Vth1$$

$$Vdata > -Vth1 + VH \quad \text{(Equation 16)}$$

Accordingly, in order to turn on the second driving transistor DT2 and turn off the first driving transistor DT1 during the first period P1, the data voltage Vdata transmitted to the first node N1 may have a range satisfying both of Equation 15 and Equation 16.

During the second period P2, the driving current Id flows in a direction from the drain to the source of the second driving transistor DT2, and a magnitude of the driving current Id may be determined according to the voltage stored in the second storage capacitor Cst2. The driving current flows through one or more second light emitting elements LED2 which may be forward biased among the light emitting diodes LED connected in parallel between the second node N2 and the second power supply line VSL. Accordingly, the second light emitting element LED2 may emit light by the driving current, and the reverse-biased first light emitting element LED1 may not emit light.

In order to turn off both the first driving transistor DT1 and the second driving transistor DT2, the data voltage Vdata transmitted to the first node N1 may have the following range.

$$-Vth1 + VH < Vdata < Vth2 + VL \quad \text{(Equation 17)}$$

Accordingly, in order to turn off both the first driving transistor DT1 and the second driving transistor DT2, it may be necessary that the following condition be satisfied.

$-V_{th1}+V_H < V_{th2}+V_L$

Accordingly, under such conditions, in a range where the data voltage Vdata may be lower than $-V_{th1}+V_H$, only the first driving transistor DT1 may be turned on such that the first light emitting element LED1 emits light, in a range where the data voltage Vdata may be between $-V_{th1}+V_H$ and $V_{th2}+V_L$, both the first driving transistor DT1 and the second driving transistor DT2 may be turned off such that neither the first light emitting element LED1 nor the second light emitting element LED2 may emit light, and in a range where the data voltage Vdata may be higher than $V_{th2}+V_L$, only the second driving transistor DT2 may be turned on such that the second light emitting element LED2 may emit light.

Figure 16:
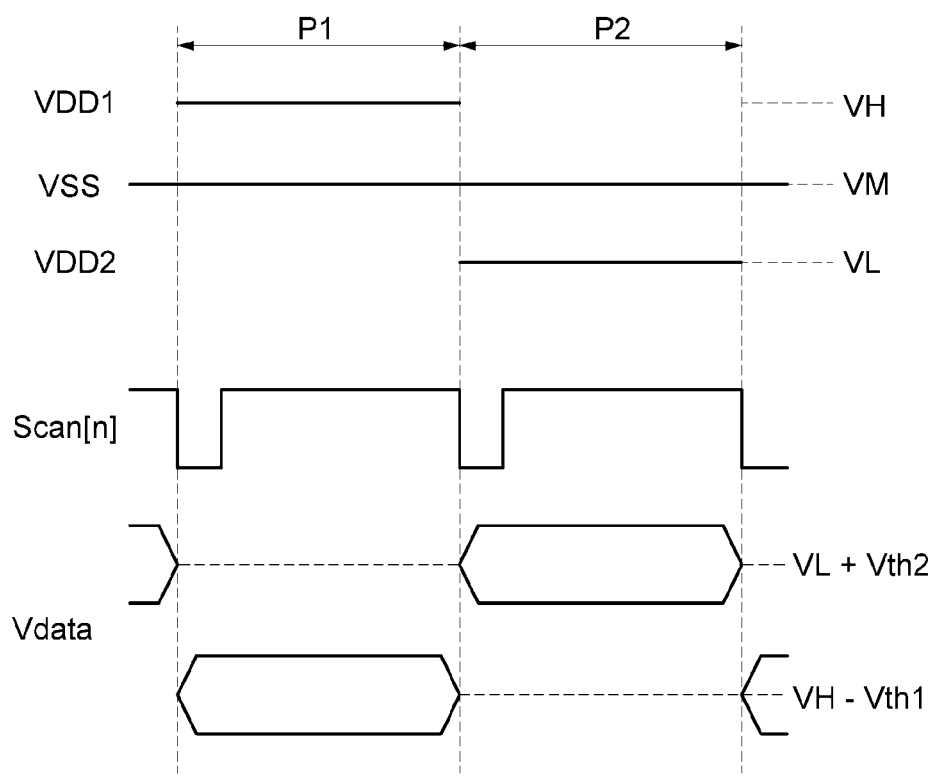
FIG. 16 is a schematic diagram illustrating an embodiment of a timing chart of the circuit diagram of FIG. 12.

FIG. 16 is a schematic diagram illustrating an embodiment of a timing chart of the circuit diagram of FIG. 12.

As described above, according to the method of driving the pixel PX according to an embodiment, a first period P1 in which the first light emitting element LED1 emits light and a second period P2 in which the second light emitting element LED2 emits light may be included, and the first period P1 and the second period P2 may be alternately repeated.

The (1-1)-st driving voltage VDD1 applied to the (1-1)-st power supply line VDL1 may be maintained at a high-level voltage VH during the first period P1 and may float during the second period P2. For example, the (1-1)-st power supply line VDL1 may be disconnected from the power supply 123 during the second period P2.

The (1-2)-nd driving voltage VDD2 applied to the (1-2)-nd power supply line VDL2 may be maintained at a low-level voltage VL during the second period P2 and may float during the first period P1. For example, the (1-2)-nd power supply line VDL2 may be disconnected from the power supply 123 during the first period P1.

The second driving voltage VSS applied to the second power supply line VSL may be maintained at an intermediate-level voltage VM during the first period P1 and the second period P2.

Figure 17:
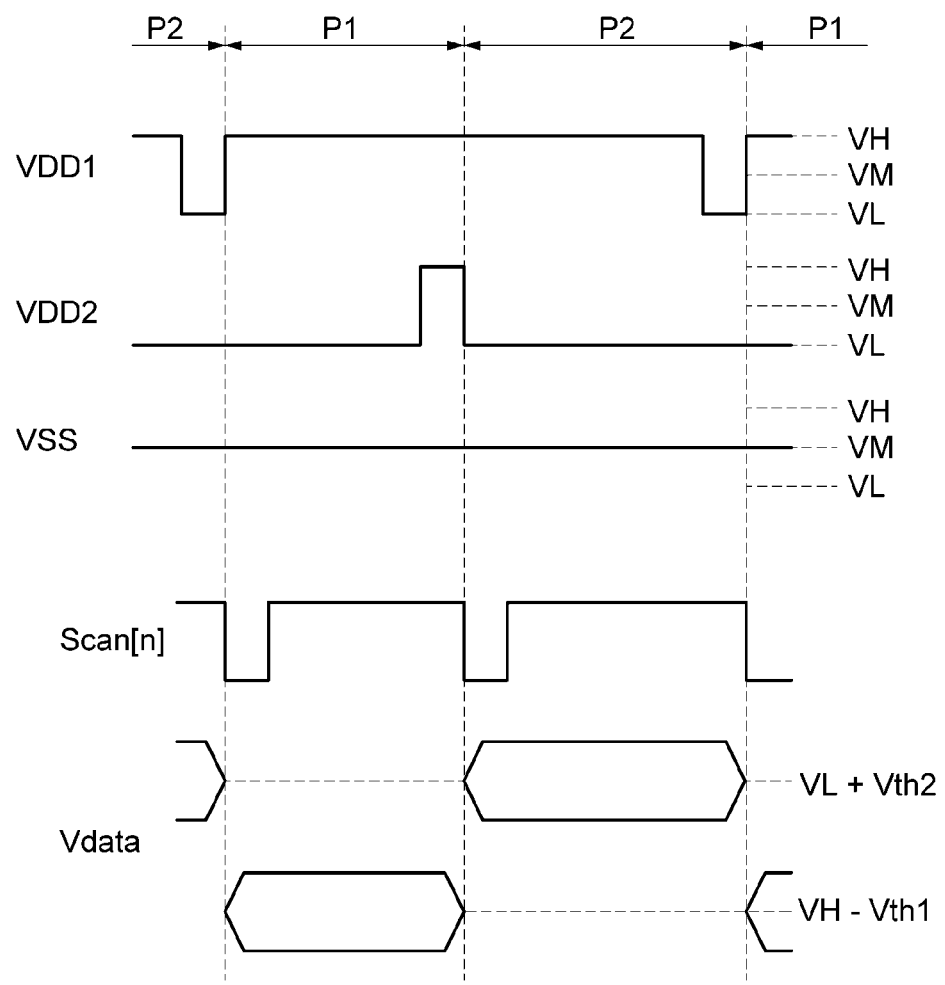
FIG. 17 is a schematic diagram illustrating another embodiment of a timing chart of the circuit diagram of FIG. 12.

FIG. 17 is a schematic diagram illustrating another embodiment of a timing chart of the circuit diagram of FIG. 12.

As described above, according to the method of driving the pixel PX according to an embodiment, a first period P1 in which the first light emitting element LED1 emits light and a second period P2 in which the second light emitting element LED2 emits light may be included, and the first period P1 and the second period P2 may be alternately repeated.

The (1-1)-st driving voltage VDD1 applied to the (1-1)-st power supply line VDL1 may be maintained at a high-level voltage VH during the first period P1. In the second period P2 immediately before entering the first period P1, for example, during a period in which the previous scan signal Scan[n−1] may be applied, a voltage having substantially the same level as the (1-2)-nd driving voltage VDD2 applied to the (1-2)-nd power supply line VDL2, that is, a low-level voltage VL, may be applied to the (1-1)-st power supply line VDL1. During the remaining second period P2, the (1-1)-st driving voltage VDD1 applied to the (1-1)-st power supply line VDL1 may be maintained at a high-level voltage VH.

Accordingly, charges charged in the first storage capacitor Cst1 may be discharged immediately before the start of the first period P1 such that the first storage capacitor Cst1 may be initialized.

The (1-2)-nd driving voltage VDD2 applied to the (1-2)-nd power supply line VDL2 may be maintained at the low-level voltage VL in the second period P2. In the first period P1 immediately before entering the second period P2, for example, during a period in which the previous scan signal Scan[n−1] may be applied, a voltage having substantially the same level as the (1-1)-st driving voltage VDD1 applied to the (1-1)-st power supply line VDL1, that is, a high-level voltage VH, may be applied to the (1-2)-nd power supply line VDL2. During the remaining first period P1, the (1-2)-nd driving voltage VDD2 applied to the (1-2)-nd power supply line VDL2 may be maintained at a low-level voltage VL.

Accordingly, charges charged in the second storage capacitor Cst2 may be discharged immediately before the start of the second period P2 such that the second storage capacitor Cst2 may be initialized.

Figure 18:
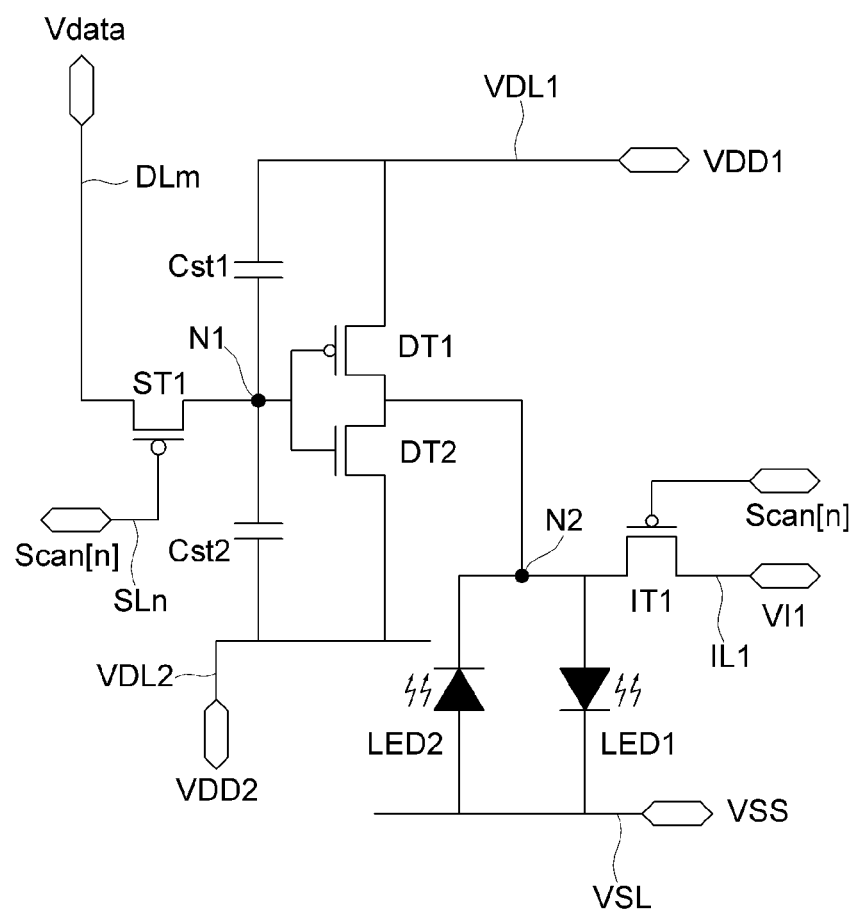
FIG. 18 is a schematic circuit diagram illustrating a circuit further including a light emitting diode initialization circuit according to an embodiment.
Figure 19:
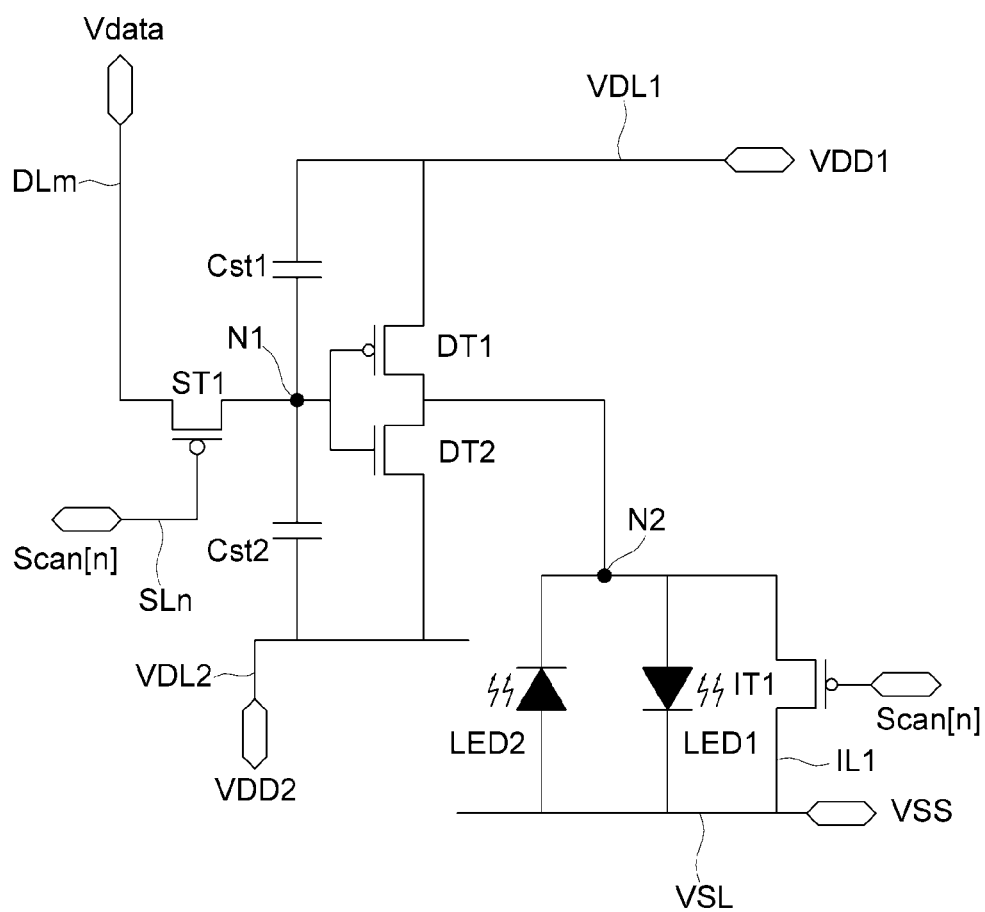
FIG. 19 is a schematic circuit diagram illustrating a circuit further including a light emitting diode initialization circuit according to another embodiment.

FIGS. 18 and 19 are circuit diagrams illustrating circuits further including a light emitting diode initialization circuit according to embodiments of the disclosure.

A light emitting diode initialization circuit of FIG. 18 may include the initialization transistor IT1 illustrated in FIG. 10 connected to the initialization power line ILL the scan line SLn, and the second node N2. A light emitting diode initialization circuit of FIG. 19 may include an initialization transistor IT1 connected to the second power supply line VSS, the scan line SLn, and the second node N2. Since the connection and operation of the light emitting diode initialization circuits of FIGS. 18 and 19 may be substantially the same as those described with reference to FIGS. 10 and 11, a detailed description thereof will be omitted.

Figure 20:
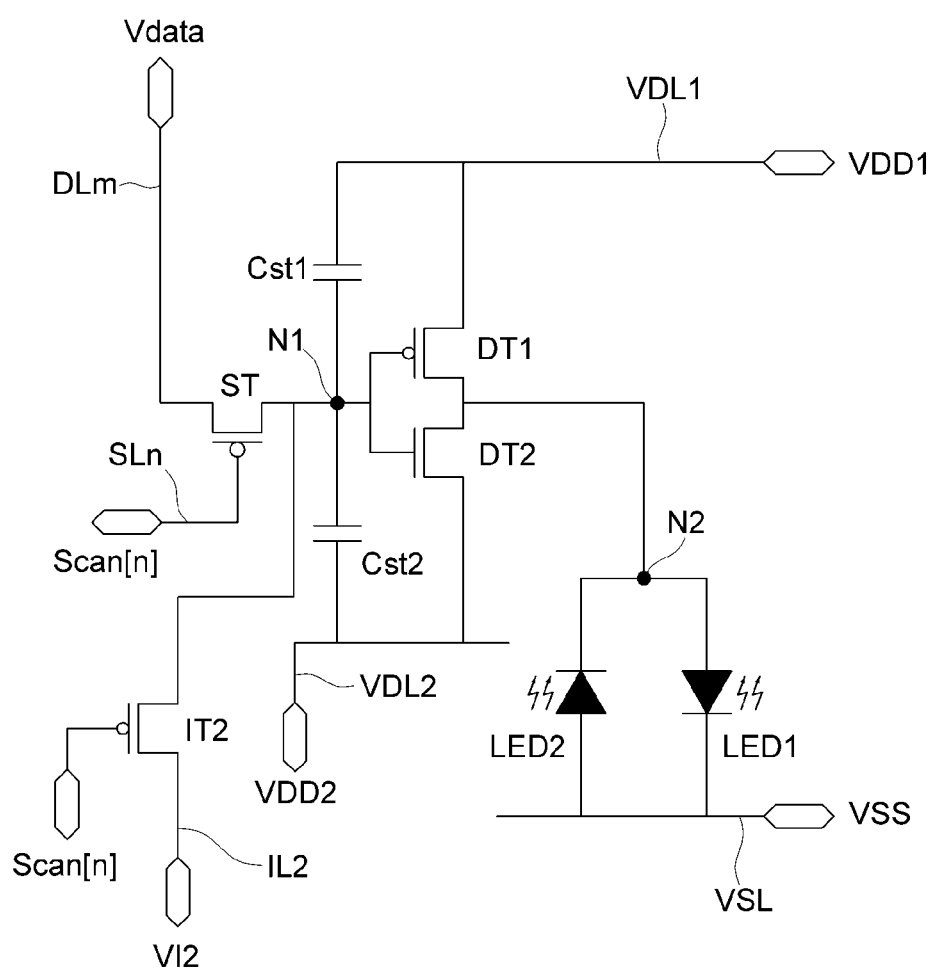
FIG. 20 is a schematic circuit diagram illustrating a circuit further including a storage capacitor initialization circuit according to embodiments of the disclosure.
Figure 21:
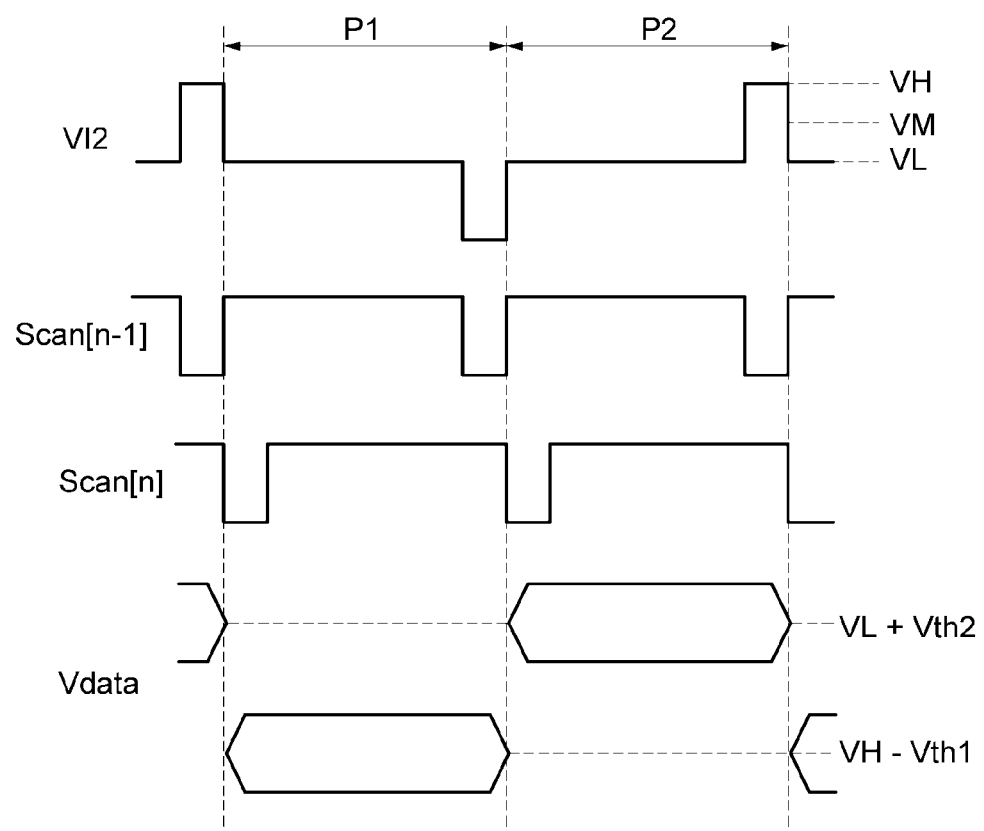
FIG. 21 is a schematic diagram illustrating an embodiment of a timing chart of the circuit diagram of FIG. 20.

FIG. 20 is a schematic circuit diagram illustrating a circuit further including a storage capacitor initialization circuit according to embodiments of the disclosure. FIG. 21 is a schematic diagram illustrating an embodiment of a timing chart of the circuit diagram of FIG. 20.

A pixel PX circuit of FIG. 20 may include a capacitor initialization circuit connected to a first node N1. Since the configuration except for the capacitor initialization circuit may be substantially the same as that of the pixel PX described with reference to FIG. 12, a detailed description thereof will be omitted.

The capacitor initialization circuit may include an initialization transistor IT2 connected to an initialization power line IL2, a previous (n−1)-th scan line SLn−1, and the first node N1.

The initialization transistor IT2 may include a gate electrode connected to the (n−1)-th scan line SLn−1 and may be connected between the initialization power line IL2 and the first node N1. One of a source electrode and a drain electrode of the initialization transistor IT2 may be connected to the initialization power line IL2, and the other of the source electrode and the drain electrode may be connected to the first node N1. For example, the source electrode of the initialization transistor IT2 may be connected to the initialization power line IL2, and the drain electrode of the initialization transistor IT2 may be connected to the first node N1. The initialization transistor IT2 may be a P-type or N-type transistor. The power supply may apply an initialization voltage VI2 to the initialization power line IL2.

Hereinafter, an initialization operation of the storage capacitors Cst1 and Cst2 of the pixel PX will be described with reference to FIGS. 20 and 21.

As described above, the first storage capacitor Cst1 may be connected between the (1-1)-st power supply line VDL1 and the first node N1, and the second storage capacitor Cst2 may be connected between the (1-2)-nd power supply line VDL2 and the first node N1.

First, charges may be accumulated and maintained across opposite ends of the first storage capacitor Cst1 and the second storage capacitor Cst2 according to the data voltage Vdata transmitted to the first node N1 during the second period P2.

In case that the previous scan signal Scan[n−1] of a low level is applied to the gate of the initialization transistor IT2 immediately before entering the first period P1, the initialization transistor IT2 may be turned on and the initialization voltage VI2 applied to the initialization power line IL2 may be transmitted to the first node N1 through the initialization transistor IT2. For example, in such an embodiment, the initialization voltage VI2 transmitted by the previous scan signal Scan[n−1] may be substantially equal to the high-level voltage VH which may be the (1-1)-st driving voltage VDD1 applied to the (1-1)-st power supply line VDL1 during the first period P1. Accordingly, charges stored in the first storage capacitor Cst1 may be discharged through the initialization transistor IT2 immediately before entering the first period P1 such that the first storage capacitor Cst1 may be initialized.

In case that the scan signal Scan[n−1] is changed again to a high-level in the switching transistor ST, the initialization transistor IT2 may be turned off upon start of the second period P2, and at the same time, in case that the current scan signal Scan[n] of a low level may be applied to the gate of the switching transistor ST, the switching transistor ST may be turned on and the data voltage Vdata may be transmitted to the storage capacitor Cst.

In case that the previous scan signal Scan[n−1] of a low level is applied to the gate of the initialization transistor IT2 immediately before entering the second period P2, the initialization transistor IT2 may be turned on and the initialization voltage VI2 applied to the initialization power line IL2 may be transmitted to the first node N1 through the initialization transistor IT2. For example, in such an embodiment, the initialization voltage VI2 transmitted by the previous scan signal Scan[n−1] may be substantially equal to the low-level voltage VL which may be the (1-2)-nd driving voltage VDD2 applied to the (1-2)-nd power supply line VDL2 during the second period P2. Accordingly, charges stored in the second storage capacitor Cst2 may be discharged through the initialization transistor IT2 immediately before entering the second period P2 such that the second storage capacitor Cst2 may be initialized.

In case that the scan signal Scan[n−1] is changed again to a high-level in the switching transistor ST, the initialization transistor IT2 may be turned off upon start of the second period P2, and at the same time, in case that the current scan signal Scan[n] of a low level is applied to the gate of the switching transistor ST, the switching transistor ST may be turned on and the data voltage Vdata may be transmitted to the storage capacitor Cst.

While the disclosure has been illustrated and described with reference to the embodiments and accompanying drawings thereof, it will be apparent to those of ordinary skill in the art that various substitutions, modifications, and changes may be employed without departing from the spirit and scope of the disclosure.

What is claimed is:
1. A pixel comprising:
   a switching transistor that transmits a data voltage to a first node;
   a storage capacitor electrically connected between a first power supply line and the first node, the storage capacitor storing the data voltage;
   a first driving transistor electrically connected to the first power supply line, the first node, and a second node;
   a second driving transistor electrically connected to the first power supply line, the first node, and the second node;
   a first light emitting element electrically connected between the second node and a second power supply line; and
   a second light emitting element electrically connected between the second node and the second power supply line; wherein
   an anode of the first light emitting element and a cathode of the second light emitting element are electrically connected to the second node,
   a cathode of the first light emitting element and an anode of the second light emitting element are electrically connected to the second power supply line,
   the first driving transistor is a P-type transistor,
   the second driving transistor is an N-type transistor,
   gates of the first and second driving transistors are electrically connected to the first node,
   sources of the first and second driving transistors are electrically connected to the first power supply line,
   drains of the first and second driving transistors are electrically connected to the second node,
   each of the first light emitting element and the second light emitting element includes at least one light emitting diode,
   in a first period, the first light emitting element is forward biased to emit light and the second light emitting element is reverse biased such that charges are accumulated across opposite ends of the at least one light emitting diode,
   in a second period, the second light emitting element is forward biased to emit light and the first light emitting element is reverse biased such that charges are accumulated across opposite ends of the at least one light emitting diode, and
   a ratio of the second period to the first period is substantially equal to a ratio of number of light emitting diodes of the second light emitting element to number of light emitting diodes of the first light emitting element.

2. The pixel of claim 1, wherein
   a gate of the switching transistor is electrically connected to a scan line to which a scan signal is applied,
   one of a source and a drain of the switching transistor is electrically connected to a data line to which the data voltage is applied, and
   the other of the source and the drain of the switching transistor is electrically connected to the first node.

3. The pixel of claim 1, wherein the at least one light emitting diode having a nano size.

4. The pixel of claim 1, wherein the first driving transistor is a PMOS and the second driving transistor is an NMOS.

5. The pixel of claim 1, wherein
   in the first period, a first driving voltage applied to the first power supply line is higher than a second driving voltage applied to the second power supply line, and
   in the second period, the first driving voltage applied to the first power supply line is lower than the second driving voltage applied to the second power supply line.

6. The pixel of claim 5, wherein the first period and the second period alternately repeat.

7. The pixel of claim 5, wherein
in the first period, the first driving transistor is turned on, and the second driving transistor is turned off, and
in the second period, the first driving transistor is turned off, and the second driving transistor is turned on.

8. The pixel of claim 5, wherein one of the first driving voltage applied to the first power supply line and the second driving voltage applied to the second power supply line maintains a constant value during the first period and the second period.

9. The pixel of claim 5, wherein each of the first period and the second period corresponds to a portion of one frame.

10. The pixel of claim 5, wherein each of the first period and the second period corresponds to at least one frame.

11. The pixel of claim 1, further comprising an initialization transistor electrically connected to the second node, wherein
a gate of the initialization transistor is electrically connected to a scan line to which a scan signal is applied,
one of a source and a drain of the initialization transistor is electrically connected to the second node, and
the other of the source and the drain of the initialization transistor is electrically connected to an initialization power line.

12. The pixel of claim 1, further comprising an initialization transistor electrically connected to the second node, wherein
a gate of the initialization transistor is electrically connected to a scan line to which a scan signal is applied,
one of a source and a drain of the initialization transistor is electrically connected to the second node, and
the other of the source and the drain of the initialization transistor is electrically connected to the second power supply line.

13. A pixel comprising:
a switching transistor that transmits a data voltage to a first node;
a first storage capacitor electrically connected between a (1-1)-st power supply line and the first node, the first storage capacitor storing the data voltage;
a second storage capacitor electrically connected between a (1-2)-nd power supply line and the first node, the second storage capacitor storing the data voltage;
a first driving transistor electrically connected to the (1-1)-st power supply line, the first node, and the second node;
a second driving transistor electrically connected to the (1-2)-nd power supply line, the first node, and the second node;
a first light emitting element electrically connected between the second node and a second power supply line; and
a second light emitting element electrically connected between the second node and the second power supply line, wherein
an anode of the first light emitting element and a cathode of the second light emitting element are electrically connected to the second node,
a cathode of the first light emitting element and an anode of the second light emitting element are electrically connected to the second power supply line,
the first driving transistor is a P-type transistor,
the second driving transistor is an N-type transistor,
gates of the first and second driving transistors are electrically connected to the first node,
a source of the first driving transistor is electrically connected to the (1-1)-st power supply line,
a source of the second driving transistor is electrically connected to the (1-2)-nd power supply line, and
drains of the first and second driving transistors are electrically connected to the second node.

14. The pixel of claim 13, wherein
a gate of the switching transistor is electrically connected to a scan line to which a scan signal is applied,
one of a source and a drain of the switching transistor is electrically connected to a data line to which the data voltage is applied, and
the other of the source and the drain of the switching transistor is electrically connected to the first node.

15. The pixel of claim 13, wherein each of the first light emitting element and the second light emitting element includes at least one light emitting diode having a nano size.

16. The pixel of claim 13, wherein the first driving transistor is a PMOS and the second driving transistor is an NMOS.

17. The pixel of claim 13, wherein
in a first period, the first driving transistor is turned on or turned off, and the second driving transistor is turned off,
in a second period, the first driving transistor is turned off, and the second driving transistor is turned on or turned off, and
the first period and the second period alternately repeat.

18. The pixel of claim 17, wherein in the first period and the second period,
a (1-1)-st driving voltage applied to the (1-1)-st power supply line is higher than a second driving voltage applied to the second power supply line, and
a (1-2)-nd driving voltage applied to the (1-2)-nd power supply line is lower than the second driving voltage applied to the second power supply line.

19. The pixel of claim 18, wherein
in the first period, the data voltage is lower than a value obtained by adding a threshold voltage of the second driving transistor to the (1-2)-nd driving voltage, and
in the second period, the data voltage is higher than a value obtained by subtracting the threshold voltage of the second driving transistor from the (1-1)-st driving voltage.

20. The pixel of claim 18, further comprising an initialization transistor electrically connected to the first node, wherein
a gate of the initialization transistor is electrically connected to a scan line to which a previous scan signal is applied,
one of a source and a drain of the initialization transistor is electrically connected to the first node,
the other of the source and the drain of the initialization transistor is electrically connected to an initialization power line,
in case that the previous scan signal is applied in the second period, an initialization voltage substantially equal to the (1-1)-st driving voltage is applied to the initialization power line, and
in case that the previous scan signal is applied in the first period, the initialization voltage substantially equal to the (1-2)-nd driving voltage is applied to the initialization power line.

21. The pixel of claim 17, wherein each of the first period and the second period corresponds to a portion of one frame.

22. The pixel of claim 17, wherein each of the first period and the second period corresponds to at least one frame.

23. The pixel of claim 17, wherein a ratio of the second period to the first period is substantially equal to a ratio of number of light emitting diodes of the second light emitting element to number of light emitting diodes of the first light emitting element.

24. The pixel of claim 17, wherein
in the first period, a (1-1)-st driving voltage applied to the (1-1)-st power supply line is higher than a second driving voltage applied to the second power supply line,
in the second period, the (1-1)-st power supply line floats,
in the second period, a (1-2)-nd driving voltage applied to the (1-2)-nd power supply line is lower than the second driving voltage applied to the second power supply line, and
in the first period, the (1-2)-nd power supply line floats.

25. The pixel of claim 17, wherein
in the first period, a (1-1)-st driving voltage applied to the (1-1)-st power supply line is higher than a second driving voltage applied to the second power supply line,
in the second period, a (1-2)-nd driving voltage applied to the (1-2)-nd power supply line is lower than the second driving voltage applied to the second power supply line,
the (1-1)-st driving voltage applied in at least a portion of the second period to the (1-1)-st power supply line is substantially equal to the (1-2)-nd driving voltage applied to the (1-2)-nd power supply line in the second period, and
the (1-2)-nd driving voltage applied in at least a portion of the first period to the (1-2)-nd power supply line is substantially equal to the (1-1)-st driving voltage applied to the (1-1)-st power supply line in the first period.

26. The pixel of claim 13, further comprising an initialization transistor connected to the second node, wherein
a gate of the initialization transistor is electrically connected to a scan line to which a scan signal is applied,
one of a source and a drain of the initialization transistor is electrically connected to the second node, and
the other of the source and the drain of the initialization transistor is electrically connected to an initialization power line.

27. The pixel of claim 13, further comprising an initialization transistor electrically connected to the second node, wherein
a gate of the initialization transistor is electrically connected to a scan line to which a scan signal is applied,
one of a source and a drain of the initialization transistor is electrically connected to the second node, and
the other of the source and the drain of the initialization transistor is electrically connected to the second power supply line.

28. The pixel of claim 13, further comprising an initialization transistor electrically connected to the first node, wherein
a gate of the initialization transistor is electrically connected to a scan line to which a previous scan signal is applied,
one of a source and a drain of the initialization transistor is electrically connected to the first node, and
the other of the source and the drain of the initialization transistor is electrically connected to an initialization power line.

* * * * *